(12) United States Patent
Testi

(10) Patent No.: US 11,070,196 B2
(45) Date of Patent: Jul. 20, 2021

(54) USING A MULTI-TONE SIGNAL TO TUNE A MULTI-STAGE LOW-NOISE AMPLIFIER

(71) Applicant: Innophase, Inc., San Diego, CA (US)

(72) Inventor: Nicolo Testi, San Diego, CA (US)

(73) Assignee: INNOPHASE INC., San Diego, CA (US)

(*) Notice: Subject to any disclaimer, the term of this patent is extended or adjusted under 35 U.S.C. 154(b) by 0 days.

(21) Appl. No.: 16/736,676

(22) Filed: Jan. 7, 2020

(65) Prior Publication Data

US 2020/0220526 A1 Jul. 9, 2020

Related U.S. Application Data

(60) Provisional application No. 62/789,498, filed on Jan. 7, 2019.

(51) Int. Cl.
*H03F 3/191* (2006.01)
*H03H 17/02* (2006.01)

(52) U.S. Cl.
CPC ......... *H03H 17/0294* (2013.01); *H03F 3/191* (2013.01); *H03H 17/0213* (2013.01); *H03F 2200/222* (2013.01); *H03F 2200/294* (2013.01); *H03F 2200/451* (2013.01)

(58) Field of Classification Search
CPC ....................................................... H03F 3/191
USPC ................................................. 330/305, 302
See application file for complete search history.

(56) References Cited

U.S. PATENT DOCUMENTS

| 4,271,412 A | 6/1981 | Glass et al. |
| 4,322,819 A | 3/1982 | Hyatt |
| 5,325,095 A | 6/1994 | Vadnais et al. |
| 5,493,581 A | 2/1996 | Young et al. |
| 5,635,864 A | 6/1997 | Jones |
| 6,161,420 A | 12/2000 | Dilger et al. |
| 6,369,659 B1 | 4/2002 | Delzer et al. |

(Continued)

FOREIGN PATENT DOCUMENTS

| CN | 103795406 A | 5/2014 |
| EP | 1187313 A1 | 3/2002 |

(Continued)

OTHER PUBLICATIONS

International Search Report and Written Opinion for PCT/US2014/029055, dated Sep. 15, 2014, 1-12 (12 pages).

(Continued)

*Primary Examiner* — Henry Choe
(74) *Attorney, Agent, or Firm* — Invention Mine LLC

(57) ABSTRACT

An example process includes reducing a quality factor of a first tunable bandpass filter, used, for example, in a low-noise amplifier stage of a polar receiver. A first wideband test signal centered at a desired center frequency of a second tunable bandpass filter is received. A frequency response of the second tunable bandpass filter to the first wideband test signal is estimated using a Fast Fourier Transform (FFT) signal processor. At least a resonant frequency or a quality factor of the second tunable bandpass filter are calibrated based at least in part on a portion of the estimated frequency response of the second tunable bandpass filter obtained from the FFT signal processor. Frequency response characteristics of the first tunable bandpass filter may be similarly tuned in accordance with the example process.

20 Claims, 18 Drawing Sheets

(56) References Cited

U.S. PATENT DOCUMENTS

| | | |
|---|---|---|
| 6,373,337 B1 | 4/2002 | Ganser |
| 6,556,636 B1 | 4/2003 | Takagi |
| 6,587,187 B2 | 7/2003 | Watanabe et al. |
| 6,975,165 B2 | 12/2005 | Lopez et al. |
| 7,042,958 B2 | 5/2006 | Biedka et al. |
| 7,095,274 B2 | 8/2006 | Lopez et al. |
| 7,193,462 B2 | 3/2007 | Braithwaite |
| 7,313,198 B2 | 12/2007 | Rahman et al. |
| 7,332,973 B2 | 2/2008 | Lee et al. |
| 7,400,203 B2 | 7/2008 | Ojo et al. |
| 7,447,272 B2 | 11/2008 | Raglan |
| 7,453,934 B2 | 11/2008 | Seppinen et al. |
| 7,564,929 B2 | 7/2009 | Lopez et al. |
| 7,602,244 B1 | 10/2009 | Holmes et al. |
| 7,773,713 B2 | 8/2010 | Cafaro et al. |
| 7,888,973 B1 | 2/2011 | Rezzi et al. |
| 8,314,653 B1 | 11/2012 | Granger-Jones et al. |
| 8,368,477 B2 | 2/2013 | Moon et al. |
| 8,390,349 B1 | 3/2013 | Ravi et al. |
| 8,421,661 B1 | 4/2013 | Jee et al. |
| 8,498,601 B2 | 7/2013 | Horng et al. |
| 8,666,325 B2 | 3/2014 | Shute et al. |
| 8,774,748 B2 | 7/2014 | Casagrande et al. |
| 8,787,511 B2 | 7/2014 | Brunn et al. |
| 8,804,875 B1 | 8/2014 | Xu et al. |
| 8,854,091 B2 | 10/2014 | Hossain et al. |
| 8,929,486 B2 | 1/2015 | Xu et al. |
| 8,941,441 B2 | 1/2015 | Testi et al. |
| 9,024,696 B2 | 5/2015 | Li et al. |
| 9,083,588 B1 | 7/2015 | Xu et al. |
| 9,178,691 B2 | 11/2015 | Shimizu et al. |
| 9,240,914 B2 | 1/2016 | Yao |
| 9,479,177 B1 | 10/2016 | Buell et al. |
| 9,497,055 B2 | 11/2016 | Xu et al. |
| 9,519,035 B2 | 12/2016 | Ramirez |
| 9,673,828 B1 | 6/2017 | Xu et al. |
| 9,673,829 B1 | 6/2017 | Xu et al. |
| 9,813,011 B2 | 11/2017 | Despesse |
| 9,813,033 B2 | 11/2017 | Testi et al. |
| 9,819,524 B2 | 11/2017 | Khoury et al. |
| 9,853,843 B2 * | 12/2017 | Talty .................. H04B 1/525 |
| 9,985,638 B2 | 5/2018 | Xu et al. |
| 10,122,397 B2 | 11/2018 | Xu et al. |
| 10,148,230 B2 | 12/2018 | Xu et al. |
| 10,158,509 B2 | 12/2018 | Xu et al. |
| 10,320,403 B2 | 6/2019 | Xu et al. |
| 10,622,959 B2 | 4/2020 | Testi et al. |
| 2001/0001616 A1 | 5/2001 | Rakib et al. |
| 2002/0048326 A1 | 4/2002 | Safilman |
| 2002/0132597 A1 | 9/2002 | Peterzell et al. |
| 2003/0053554 A1 | 3/2003 | McCrokle et al. |
| 2003/0058036 A1 | 3/2003 | Stillman et al. |
| 2003/0142002 A1 | 7/2003 | Winner et al. |
| 2003/0174783 A1 | 9/2003 | Rahman et al. |
| 2004/0036538 A1 | 2/2004 | Devries et al. |
| 2004/0100330 A1 | 5/2004 | Chandler |
| 2004/0146118 A1 | 7/2004 | Talwalkar et al. |
| 2005/0285541 A1 | 12/2005 | Lechevalier |
| 2006/0078079 A1 | 4/2006 | Lu |
| 2006/0145762 A1 | 7/2006 | Leete |
| 2006/0193401 A1 | 8/2006 | Lopez et al. |
| 2006/0222109 A1 | 10/2006 | Watanabe et al. |
| 2006/0285541 A1 | 12/2006 | Roy |
| 2007/0132511 A1 | 6/2007 | Ryynänen et al. |
| 2008/0069514 A1 | 3/2008 | Son et al. |
| 2008/0079497 A1 | 4/2008 | Fang et al. |
| 2008/0112526 A1 | 5/2008 | Yi |
| 2008/0150645 A1 | 6/2008 | McCorquodale et al. |
| 2008/0170552 A1 | 7/2008 | Zaks |
| 2008/0192872 A1 | 8/2008 | Lindoff |
| 2008/0192877 A1 | 8/2008 | Eliezer et al. |
| 2008/0205709 A1 | 8/2008 | Masuda et al. |
| 2008/0211576 A1 | 9/2008 | Moffatt et al. |
| 2008/0220735 A1 | 9/2008 | Kim et al. |
| 2008/0225981 A1 | 9/2008 | Reddy et al. |
| 2008/0225984 A1 | 9/2008 | Ahmed et al. |
| 2008/0291064 A1 | 11/2008 | Johansson et al. |
| 2009/0153244 A1 | 6/2009 | Cabanillas et al. |
| 2009/0256601 A1 | 10/2009 | Zhang et al. |
| 2009/0295493 A1 | 12/2009 | Lee et al. |
| 2009/0302908 A1 | 12/2009 | Nakamura |
| 2010/0303047 A1 | 12/2010 | Ibrahim et al. |
| 2011/0003571 A1 | 1/2011 | Park et al. |
| 2011/0019657 A1 | 1/2011 | Zaher |
| 2011/0050296 A1 | 3/2011 | Fagg |
| 2011/0140737 A1 | 6/2011 | Rivoir |
| 2011/0159877 A1 | 6/2011 | Kenington et al. |
| 2011/0260790 A1 | 10/2011 | Haddad |
| 2011/0298557 A1 | 12/2011 | Kobayashi |
| 2011/0299632 A1 | 12/2011 | Mirzaei et al. |
| 2011/0300885 A1 | 12/2011 | Darabi et al. |
| 2012/0032718 A1 | 2/2012 | Chan et al. |
| 2012/0074990 A1 | 3/2012 | Sornin |
| 2012/0256693 A1 | 10/2012 | Raghunathan et al. |
| 2012/0306547 A1 | 12/2012 | Arora et al. |
| 2013/0143509 A1 | 6/2013 | Horng et al. |
| 2013/0257494 A1 | 10/2013 | Nikaeen et al. |
| 2014/0023163 A1 | 1/2014 | Xu |
| 2014/0133528 A1 | 5/2014 | Noest et al. |
| 2014/0185723 A1 | 7/2014 | Belitzer |
| 2014/0266454 A1 | 9/2014 | Testi et al. |
| 2014/0266480 A1 | 9/2014 | Li et al. |
| 2014/0269999 A1 | 9/2014 | Cui et al. |
| 2014/0270003 A1 | 9/2014 | Xu et al. |
| 2014/0321479 A1 | 10/2014 | Zhang et al. |
| 2015/0180685 A1 | 6/2015 | Noest et al. |
| 2015/0207499 A1 | 7/2015 | Horng et al. |
| 2015/0229318 A1 | 8/2015 | Tamura et al. |
| 2016/0074224 A1 | 3/2016 | Scheller et al. |
| 2016/0139568 A1 | 5/2016 | Schimper |
| 2016/0155558 A1 | 6/2016 | Groves et al. |
| 2016/0169717 A1 | 6/2016 | Zhitomirsky |
| 2017/0085405 A1 | 3/2017 | Xu et al. |
| 2017/0163272 A1 | 6/2017 | Xu et al. |
| 2017/0187364 A1 | 6/2017 | Park et al. |
| 2017/0194973 A1 | 7/2017 | Moehlmann |
| 2018/0196972 A1 | 7/2018 | Lu et al. |
| 2018/0205384 A1 | 7/2018 | Lee |
| 2018/0287646 A1 | 10/2018 | Xu et al. |
| 2019/0059055 A1 | 2/2019 | Murali |
| 2020/0083857 A1 | 3/2020 | Testi et al. |

FOREIGN PATENT DOCUMENTS

| | | |
|---|---|---|
| EP | 1187313 B1 | 2/2008 |
| JP | H07221570 A | 8/1995 |
| JP | H1188064 A | 3/1999 |
| JP | 2012134981 A | 7/2012 |
| KR | 20150007728 A | 1/2015 |
| WO | 2005078921 A2 | 8/2005 |
| WO | 2005078921 A3 | 4/2006 |
| WO | 2012132847 A1 | 10/2012 |

OTHER PUBLICATIONS

International Search Report and Written Opinion for PCT/US2016/053484, dated Dec. 19, 2016, 1-8 (8 pages).

International Search Report and Written Opinion for PCT/US2016/064772, dated Feb. 28, 2017, 1-7 (7 pages).

International Preliminary Report on Patentability for PCT/US2018/027222 completed Apr. 4, 2019, dated Jun. 20, 2019, 1-3 (3 pages).

International Search Report and Written Opinion for PCT/US2014/030525, dated Jul. 24, 2014, 1-16 (16 pages).

International Search Report and Written Opinion for PCT/US2014/026459, dated Jul. 28, 2014, 1-10 (10 pages).

International Search Report and Written Opinion of the International Searching Authority for PCT/US13/024159, dated Apr. 9, 2013, 1-8 (8 pages).

International Preliminary Report on Patentability for PCT/US2016/064772, dated Jun. 14, 2018, 1-6 (6 pages).

International Search report and Written Opinion for PCT/US18/27222, dated Jun. 28, 2018, 1-6 (6 pages).

(56) References Cited

OTHER PUBLICATIONS

Aeroflex, "Measurement of Frequency Stability and Phase Noise", Application Note, Part No. 46891/865, Issue 1, Feb. 2007, 1-8 (8 pages).
Betancourt-Zamora, Rafael, et al., "1-GHz and 2.8-GHz CMOS Injection-Locked Ring Oscillator Prescalers", Allen Center for Integrated Systems, Stanford University, Conference Paper, Feb. 2001, 1-5 (5 pages).
Chen, Chi-Tsan, et al., "Cognitive Polar Receiver Using Two Injection-Locked Oscillator Stages", IEEE Transactions on Microwave Theory and Techniques, vol. 59, No. 12, Dec. 2011, 3484-3493 (10 pages).
Chen, Chi-Tsan, et al., "Wireless Polar Receiver Using Two Injection-Locked Oscillator Stages for Green Radios", IEEE MTT-S International, Jun. 2011, 1-4 (4 pages).
Cheng, Mao, et al., "A 1.3mW 0.6V WBAN-Compatible Sub-Sampling PSK Receiver in 65nm CMOS", IEEE International Solid-State Circuits Conference, ISSCC Session 9.6, Feb. 11, 2014, 168-170 (3 pages).
Chien, Jun-Chau, et al., "Analysis and Design of Wideband Injection-Locked Ring Oscillators With Multiple-Input Injection", IEEE Journal of Solid-State Circuits, vol. 42, No. 9, Sep. 2007, 1906-1915 (10 pages).
Darvishi, Milad, et al., "A 0.3-to-1.2GHz Tunable 4th-Order Switched gm-C Bandpass Filter with >55dB Ultimate Rejection and Out-of-Band IIP3 of +29dBm", 2012 IEEE International Solid-State Circuits Conference, Session 21.1, 2012, 358-360 (3 pages).
Dudek, Piotr, et al., "A High-Resolution CMOS Time-to-Digital Converter Utilizing a Vernier Delay Line", IEEE Transactions on Solid-State Circuits, vol. 35, No. 2, Feb. 2000, 240-247 (8 pages).
Effendrik, Popong, "Time-to-Digital Converter (TDC) for WiMAX ADPLL in State-of-The-Art 40-nm CMOS", MSc Theses, Delft University of Technology, Apr. 18, 2011, 1-80 (80 pages).
Frantz, Claude, "Frequency Discriminator", DJ0OT, 1994, 1-7 (7 pages).
He, Xin, et al., "A 2.5-GHz Low-Power, High Dynamic Range, Self-Tuned Q-Enhanced LC Filter in SOI", IEEE Journal of Solid-State Circuits, vol. 40, No. 8, Aug. 2005, 1618-1628 (11 pages).
He, Xin, et al., "A Fully Integrated Q-enhanced LC Filter with 6 dB Noise Figure at 2.5 GHz in SOI", IEEE Radio Frequency Integrated Circuits Symposium, 2004, 643-646 (4 pages).
Henzler, S., "Time to Digital Converters", Springer Series in Advanced Microelectronics 29, Chapter 2, Springer Science+ Business Media B.V., 2010, 5-19 (15 pages).
Hewlett Packard, "Phase Noise Characterization of Microwave Oscillators", Frequency Discriminator Method, Product Note 11729C-2, Sep. 1985, 1-45 (45 pages).
Jovanovic, G.S., et al., "Vernier's Delay Line Time-to-Digital Converter", Scientific Publications of the State University of Novi Pazar, Ser. A: Appl. Math. Inform. and Mech., vol. 1, 1, 2009, 11-20 (10 pages).
Li, Dandan, et al., "Design Techniques for Automatically Tuned Integrated Gigahertz-Range Active LC Filters", IEEE Journal of Solid-State Circuits, vol. 37, No. 8, Aug. 2002, 967-977 (11 pages).
Liao, Dongyi, et al., "An 802.11a/b/g/n. Digital Fractional-N PLL With Automatic TDC Linearity Calibration for Spur Cancellation", IEEE Journal of Solid-State Circuits, 0018-9200, Jan. 16, 2017, 1-11 (11 pages).
Lin, Chin-Fisin, et al., "Single-Stage Vernier Time-to-Digital Converter with Sub-Gate Delay Time Resolution", Scientific Research, Circuits and Systems, vol. 2, Oct. 2011, 365-371 (7 pages).
Liscidini, Antonio, et al., "Time to Digital Converter based on a 2-dimensions Vernier architecture", University of Pavia, IEEE Custom Integrated Circuits Conference, Sep. 13, 2009, 1-4 (4 pages).
López-Villegas, José Maria, et al., "BPSK to ASK Signal Conversion Using Injection-Locked Oscillators—Part I: Theory", IEEE Transactions on Microwave Theory and Techniques, vol. 53, No. 12, Dec. 2005, 3757-3766 (10 pages).

Mirzaei, Ahmad, et al., "Multi-Phase Injection Widens Lock Range of Ring-Oscillator-Based Frequency Dividers", IEEE Journal of Solid-State Circuits, vol. 43, No. 3, Mar. 2008, 656-671 (16 pages).
Nazari, Peyman, "Polar Quantizer for Wireless Receivers: Theory, Analysis, and CMOS Implementation", IEEE Transactions on Crcuits and Systems, vol. 61, No. 3, Mar. 2014, 1-94 (94 pages).
O'Brien, Paul, "A Comparison of Two Delay Line Discriminator Implementations for Low Cost Phase Noise Measurement", Analog Devices Raheen Business Park Limerick Ireland, 2010, 1-11 (11 pages).
Pellerano, Stefano, et al., "A 4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 3422-3433 (12 pages).
Putnam, William, et al., "Design of Fractional Delay Filters Using Convex Optimization", IEEE ASSP Workshop on Applications of Signal Processing to Audio and Acoustics (CCRMA), Stanford University, 1997, 1-5 (5 pages).
Rategh, Hamid R., et al., "Superharmonic Injection Locked Oscillators as Low Power Frequency Dividers", Stanford University, Symposium on VLSI Circuits, Digest of Technical Papers, Jun. 1998, 1-4 (4 pages).
Razavi, Behzad, "A Study of Injection Pulling and Locking in Oscillators", Electrical Engineering Department, University of California, IEEE Custom Integrated Circuits Conference, 2003, 305-312 (8 pages).
Ross, Andrew, "Power Save Issues in WLAN", Silex Technology America, Inc., 2014, 1-35 (35 pages).
Siripon, N., et al., "Novel Sub-Harmonic Injection-Locked Balanced Oscillator", Microwave and Systems Research Group (MSRG), School of Electronics, Computing and Mathematics, University of Surrey, 31st European Microwave Conference, Sep. 24, 2011, 1-4 (4 pages.
Testi, Nicolo, et al., "A 2.4GHz 72dB-Variable-Gain 100dB-DR 7.8mW 4th-Order tunable Q-Enhanced LC Band-Pass Filter.", IEEE Radio Frequency Integrated Circuits Symposium (RFIC), 2015, 87-90 (4 pages).
Tiebout, Marc, "A 50GHz Direct Injection Locked Oscillator Topology as Low Power Frequency Divider in 0.13 μm CMOS", Infineon Technologies AG, Solid-State Circuits Conference, 29th European ESSCIRC, 2003, 1-4 (4 pages).
Tsai, Pei-Kang, et al., "Wideband Injection-Locked Divide-by-3 Frequency Divider Design with Regenerative. Second-Harmonic Feedback Technique", Wideband Injection-Locked Divide-by-3 Frequency Divider Design with Regenerative Second-Harmonic Feedback Technique, Mar. 21, 2013, 1-4 (4 pages).
US Navy, "Electronic Warfare and Radar Systems Engineering Handbook", Naval Air Systems Command and Naval Air Warfare Center, USA, Mixers and Frequency Discriminators, Section 6-8.1 to 6-8.2, Apr. 1, 1999, 1-299 (299 pages).
Winoto, Renaldi, et al., "A 2x2 WLAN and Bluetooth Combo SoC in 28nm CMOS with On-Chip WLAN Digital Power Amplifier, Integrated 2G/BT SP3T Switch and BT Pulling Cancelation", IEEE International Solid-State Circuits Conference, ISSCC 2016, Session 9.4, High-Performance Wireless, Feb. 2, 2016, 170-172 (3 pages).
Wiser, Robert F., et al., "A 5-GHz Wireless LAN Transmitter with Integrated Tunable High-Q RF Filter", IEEE Journal of Solid-State Circuits, vol. 44, No. 8, Aug. 2009, 2114-2125 (12 pages).
Yu, Jianjun, et al., "A 3-Dimensional Vernier Ring Time-to-digital Converter in 0.13 μm CMOS", Electrical and Computer Engineering, Auburn University, Auburn AL, Sep. 19, 2010, 1-4 (4 pages).
International Search report and Written Opinion for PCT/US20/12607, dated May 17, 2020, 1-17 (17 pages).
Buckel, Tobias, et al., "A Highly Reconfigurable RF-DPLL Phase Modulator for Polar Transmitters in Cellular RFICs", IEEE Transactions on Microwave Theory and Techniques, vol. 66, No. 6, Jun. 2018, 2618-2627 (10 pages.
Markulic, Nereo, et al., "A self-calibrated 10Mb/s phase modulator with -37.4dB EVM based on a 10.1-to-12.4GHz, -246.6dB-FOM, fractional-n subsampling PLL", IEEE International Solid-State Circuits Conference (ISSCC), San Francisco, Session 9.7, 2016, 176-178 (3 pages).

(56) References Cited

OTHER PUBLICATIONS

Marzin, Giovanni, et al., "A 20Mb/s Phase Modulator Based on a 3.6GHz Digital PLL with -36dB EVM at 5 mW Power", IEEE International Solid-State Circuits Conference, vol. 47, No. 12, Dec. 2012, 2974-2988 (15 pages).

International Search Report and Written Opinion for PCT/US2019/067237, dated Apr. 24, 2020, 1-14 (14 pages).

International Search Report and Written Opinion for PCT/US2019/049493, dated Apr. 29, 2020, 1-10 (10 pages).

International Search Report and Written Opinion for PCT/US2019/057432, dated Apr. 6, 2020, 1-9 (9 pages).

Buckel, Tobias, et al., "A Novel Digital-Intensive Hybrid Polar-I/Q RF Transmitter Architecture", IEEE Transactions on Circuits and Systems-1, Regular Papers, vol. 65, No. 12, Dec. 2018, 4390-4403 (14 pages).

\* cited by examiner

1800

┌─ 1802
FILTERING, USING A TUNABLE BANDPASS FILTER, A WIDEBAND TEST SIGNAL, WHEREIN THE WIDEBAND TEST SIGNAL IS CENTERED AT A DESIRED CENTER FREQUENCY OF THE TUNABLE BANDPASS FILTER

┌─ 1804
APPLYING A FAST FOURIER TRANSFORM (FFT) ALGORITHM TO THE FILTERED VERSION OF THE WIDEBAND TEST SIGNAL TO ESTIMATE A FREQUENCY RESPONSE OF THE TUNABLE BANDPASS FILTER

┌─ 1806
CALIBRATING THE TUNABLE BANDPASS FILTER BY ADJUSTING AT LEAST ONE OF A QUALITY FACTOR AND A RESONANT FREQUENCY OF THE TUNABLE BANDPASS FILTER BASED AT LEAST IN PART ON THE ESTIMATED FREQUENCY RESPONSE OF THE TUNABLE BANDPASS FILTER AT THE DESIRED CENTER FREQUENCY OF THE TUNABLE BANDPASS FILTER AND ONE OR MORE OTHER FREQUENCIES DEFINING A DESIRED BANDWIDTH OF THE TUNABLE BANDWIDTH FILTER

USING A MULTI-TONE SIGNAL TO TUNE A MULTI-STAGE LOW-NOISE AMPLIFIER

CROSS-REFERENCE TO RELATED APPLICATIONS

This present application is a non-provisional filing of, and claims benefit under 35 U.S.C. § 119(e) from, U.S. Provisional Patent Application No. 62/789,498, filed Jan. 7, 2019, entitled "USING A MULTI-TONE SIGNAL TO TUNE A MULTI-STAGE LOW-NOISE AMPLIFIER," which is hereby incorporated by reference in its entirety.

BACKGROUND

Tunable and highly selective RF filters are used in modern reconfigurable transceivers. On-chip band-pass filters (BPFs) become more attractive than typical off-chip SAW and BAW filters due to their flexibility. BPFs, or, in some cases, Low-Noise Amplifiers (LNAs) that incorporate BPFs, may be cascaded together in a particular application with a defined channel frequency. Calibrating BPFs (or LNAs with BPF capability) to achieve a desired frequency response can consume power, time, and chip real estate. Reducing time in calibrating on-chip BPFs may be advantageous in some applications.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts disclosed herein, and explain various principles and advantages of those embodiments.

FIG. 18 is a flow diagram illustrating another example method in accordance with some embodiments.

Figure 1A:
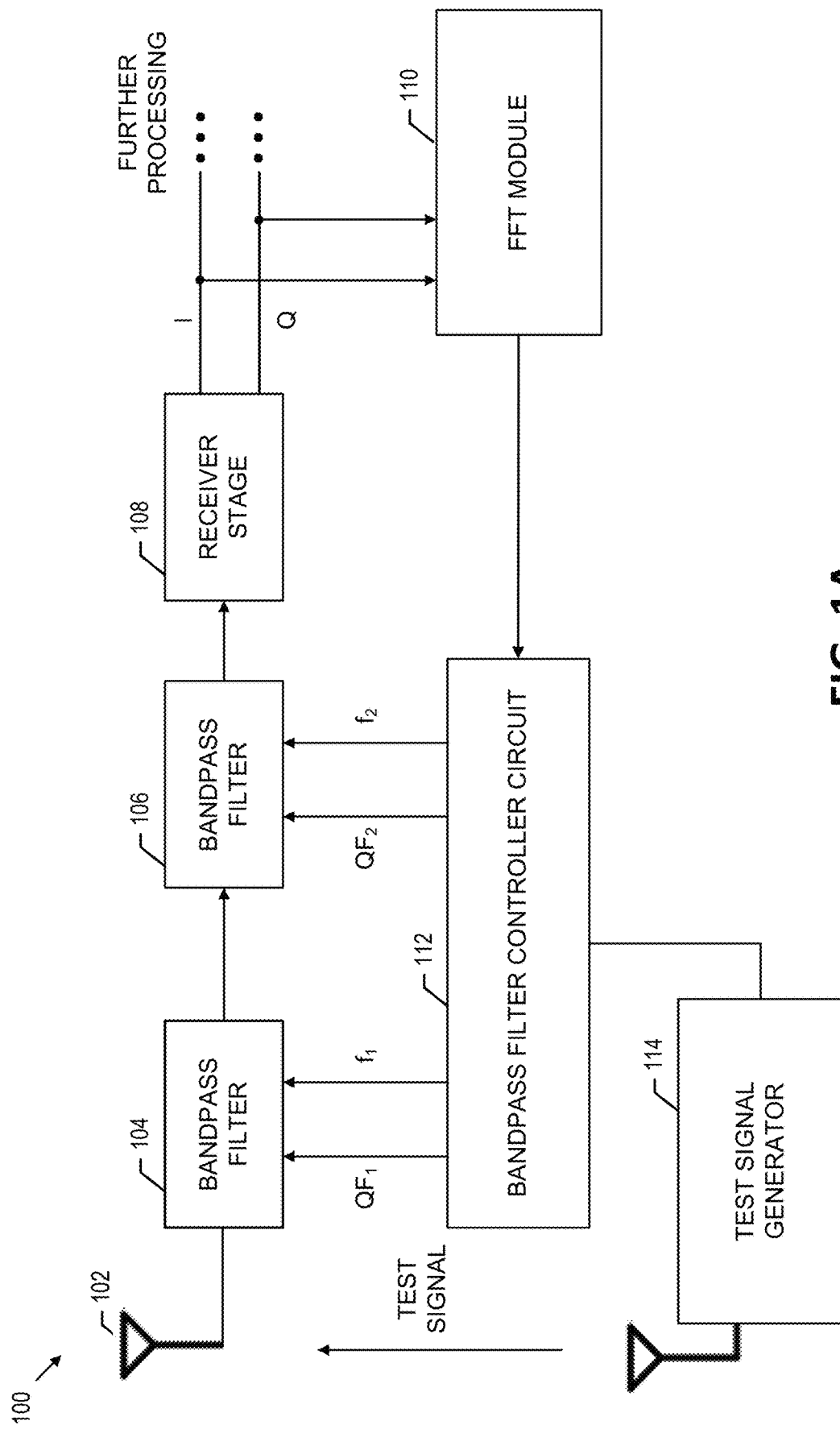
FIG. 1A is a block diagram of an example bandpass filter calibration system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

Before proceeding with this detailed description, it is noted that the entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . ." And it is for reasons akin to brevity and clarity of presentation that this implied leading clause is not repeated ad nauseum in this detailed description.

Referring now to FIG. 1A, it is a block diagram of an example bandpass filter calibration system 100 in accordance with some embodiments. A signal, e.g., a modulated signal is received at an antenna 102 and input to a first bandpass filter 104, e.g., a tunable bandpass filter. The first bandpass filter 104 is cascaded with a second bandpass filter 106, e.g., a tunable bandpass filter. An analog output from the second bandpass filter 106 is input to a receiver stage 108, e.g., a receiver demodulation stage. In some embodiments, and in accordance with some designs, the receiver stage 108 may be or may include a polar receiver.

In the example calibration system 100 shown in FIG. 1A, the receiver stage 108 is shown to have I and Q (in-phase and quadrature) digital baseband output or digital bit output sequences. Other receiver and calibration systems 100 may be possible, for example, the receiver stage 108 may be, or may include, a polar receiver that has, e.g., amplitude and phase digital outputs. These amplitude and phase outputs may be, e.g., converted to I and Q digital outputs (e.g., by a signal generator such as a CORDIC (COordinate Rotation Digital Computer). It will be understood that any variety of receiver and demodulation designs (e.g., polar to rectangular coordinates, rectangular to polar coordinates, other coordinate systems, rectangular coordinates only, etc.) may be used with the example calibration system 100.

Regardless of the particular coordinate mapping or modulation scheme used, digital output values from the receiver stage 108 are input to a Fast Fourier Transform (FFT) module 110 (e.g., an FFT signal processor), which provides, e.g., amplitude or power magnitudes for frequency components across a defined frequency spectrum. In some embodiments, at least some output values from the FFT module 110 are provided to a bandpass filter (BPF) controller circuit 112, e.g., a calibration controller circuit. The BPF controller circuit 112 may use one or more FFT output values of the FFT module 110 to calibrate the frequency response of one or more of the first and second bandpass filters 104, 106 using, e.g., control inputs to the first and second bandpass filter 104, 106.

The BPF controller circuit 112 may control a test signal generator 114 (e.g., during at least a testing mode) to generate one or more test signals, such as a wideband test signal. A test signal generated by the test signal generator 114, e.g., during a testing mode, may go in directly to the first bandpass filter 104, or, in, e.g., as in some embodiments in which the test signal generator 114 is a transmitter, a test signal may more generally be transmitted through the air and received at antenna 102 for processing in, e.g., the first bandpass filter 104, the second bandpass filter 106, and so on through to the FFT module 110. In some embodiments, the test signal generator 114 is a local transmitter to the bandpass filters 104, 106 and the antenna 102. In some embodiments, the test signal generator 114 may be a polar transmitter, although any suitable transmitter may be used. In some embodiments, the test signal generator 114 (e.g., a transmitter) is configured to transmit, e.g., modulated signals during a regular operating mode and is further configured to transmit a test signal during, e.g., a testing mode.

In some embodiments, the wideband test signal may be an Orthogonal Frequency Division Multiplexing (OFDM) training sequence or signal, made up of, e.g., 56 separate tones or carrier frequencies and having uniform flat unmodulated magnitudes at the 56 separate tones or carrier frequencies. It will be understood that other types of test signals may be used, wideband or otherwise. For example, a test signal may be a multi-tone signal that includes multiple tones in the same signal (e.g., rather than multiple tones in separate, consecutively sent signals). In some embodiments, regulatory requirements or system-specific requirements might make use of a particular type of test signal (e.g., the OFDM training signal) particularly apt for a given implementation, particularly if the signal is to be transmitted through the air.

Although two bandpass filters 104, 106 are shown in FIG. 1A, other filters such as bandpass filters may be used, e.g., for a total of "N" cascaded filters, some or all of which may be calibrated in accordance with the example calibration system 100 shown in FIG. 1A. Although the two bandpass filter 104, 106 are shown as being located before the receiver stage 108, one or more (or all) of the N bandpass filters may be part of receiver stage 108, or one or more (or all) of the N bandpass filters may be located after the receiver stage 108.

In some embodiments, the two bandpass filter 104, 106 (or, e.g., N filters) may be respectively part of an amplifier stage, e.g., a low-noise amplifier (LNA) stage. In some embodiments, each LNA stage may include a gain stage and a bandpass filter, e.g., a tunable bandpass filter stage. In some embodiments, N LNA stages may be cascaded, e.g., with or without one or more intervening buffer stages. In some embodiments, an initial wideband LNA stage (not shown in FIG. 1A) that, e.g., may serve as a matching circuit for a balun coupled to the antenna 102, may precede the first bandpass filter 104 (e.g., with the filter 104 implemented as part of an LNA). In some embodiments, N LNA stages may be cascaded, with N−1 LNA stages including N−1 respective tunable bandpass filters following an initial wideband LNA stage.

The FFT module 110 may be implemented in hardware, e.g., as one or more FFT signal processing devices (e.g., an FFT signal processor). In some embodiments, the FFT module 110 may be part of a larger system block, used, e.g., for other purposes than, e.g., bandpass filter calibration. For example, the FFT module 110 may be part of a digital baseband signal processing (e.g., demodulation, or modulation) block.

In some embodiments, the outputs of the receiver stage 108, e.g., I and Q digital baseband outputs, may be used elsewhere in subsequent digital signal processing (e.g., demodulation, or modulation) blocks.

In some embodiments, as shown in FIG. 1A, the first bandpass filter 104 receives control inputs $QF_1$ and $f_1$, and the second bandpass filter 106 receives control inputs $QF_2$ and $f_2$. The control inputs $QF_1$ and $QF_2$ and $f_1$ and $f_2$ respectively represent quality factor ("QF," "Q") and frequency control inputs for the bandpass filters 104, 106 that may permit tuning of the bandpass filters 104, 106.

In general, for a bandpass filter, e.g., 104, 106 the quality factor control input may be used to adjust the quality factor QF, which adjusts the bandwidth of the bandpass filter, defined between a lower cutoff frequency $f_{lcutoff}$ (or −3 dB point, 3 dB down point, lower 3 dB point) and an upper cutoff frequency $f_{ucutoff}$ (or −3 dB point, 3 dB down point, upper 3 dB point) for the bandpass filter. A −3 dB point refers to a signal magnitude that is 0.707 (at least theoretically) down from a maximum center value for the bandpass filter. Lowering the QF or quality factor for a bandpass filter results in a wider bandwidth and a flatter frequency response, while increasing the Q for a bandpass filter results in a sharper, narrower, frequency response with a corresponding narrower bandwidth.

In some embodiments, the first and second bandpass filters 104, 106 may be implemented and designed as "high-Q" filters, e.g., with a Q (QF) of 200 or even 400 or 500.

In general, for a bandpass filter, e.g., 104, 106, the frequency control input may be used to adjust the resonant frequency $f_0$, which may be defined as a frequency at which the filter has a maximum response, and perhaps less directly, the center frequency $f_c$, which, in some embodiments, may be defined as the midpoint frequency between the upper and lower cutoff frequencies. In general, the upper and lower cutoff frequencies may have signal magnitudes that are −3 dB down from the signal magnitude at the center frequency G. Reducing the resonant frequency (and, e.g., less directly, the center frequency) for a bandpass filter, while not in itself generally affecting the size of the bandwidth, may generally result in a shift (e.g., a "left-ward" shift) of the bandwidth lower in frequency while increasing the resonant frequency (and, e.g., less directly, the center frequency) for a bandpass filter may generally result in a shift (e.g., a "right-ward" shift) of the bandwidth higher in frequency.

In some embodiments, the quality factor (QF) (and thus the bandwidth) and the frequency (e.g., the resonant frequency) may be adjusted independently (generally, although adjusting one or the other might have other effects on a frequency response), or may be adjusted (effectively or otherwise) in together. In some embodiments, adjustment of the quality factor QF and the resonant frequency may be performed iteratively, e.g., toward a desired frequency response, including, e.g., a desired quality factor QF and/or desired center frequency G.

In some embodiments, Q adjustment may be accomplished, e.g., by way of adjusting a source of bias current to the bandpass filter, by, e.g., controlling a bias transistor.

The center frequency $f_c$, which, in some embodiments, may be defined as the midpoint frequency between the upper and lower cutoff frequencies, may or may not coincide with the resonant frequency $f_0$ (or $\omega_0$, depending how presented) for the bandpass filter, a frequency that may depend on resistive ("R"), inductive ("L"), and capacitive ("C") values of circuit elements used in design of and to implement the filter. In some embodiments, the bandpass filter may be designed as an "LC" filter, although it will be understood that a variety of other filter designs are possible. The resonant frequency may be defined as a frequency at which the filter has a maximum response. Although the center frequency $f_c$ and the resonant frequency $f_0$ may not be identical in many practical circumstances or instances, these values may be adjusted in a similar manner, by selectively adding in circuit elements, e.g., adding or subtracting capacitors from switchable capacitor banks to a LC filter to alter a value of the resonant frequency $f_0$ and thus generally causing the center frequency $f_c$ of the filter to change as well. As such, in at least some embodiments, the frequency control input may be understood to be generally an, e.g., resonant frequency $f_0$ control input for a bandpass filter.

Figure 2:
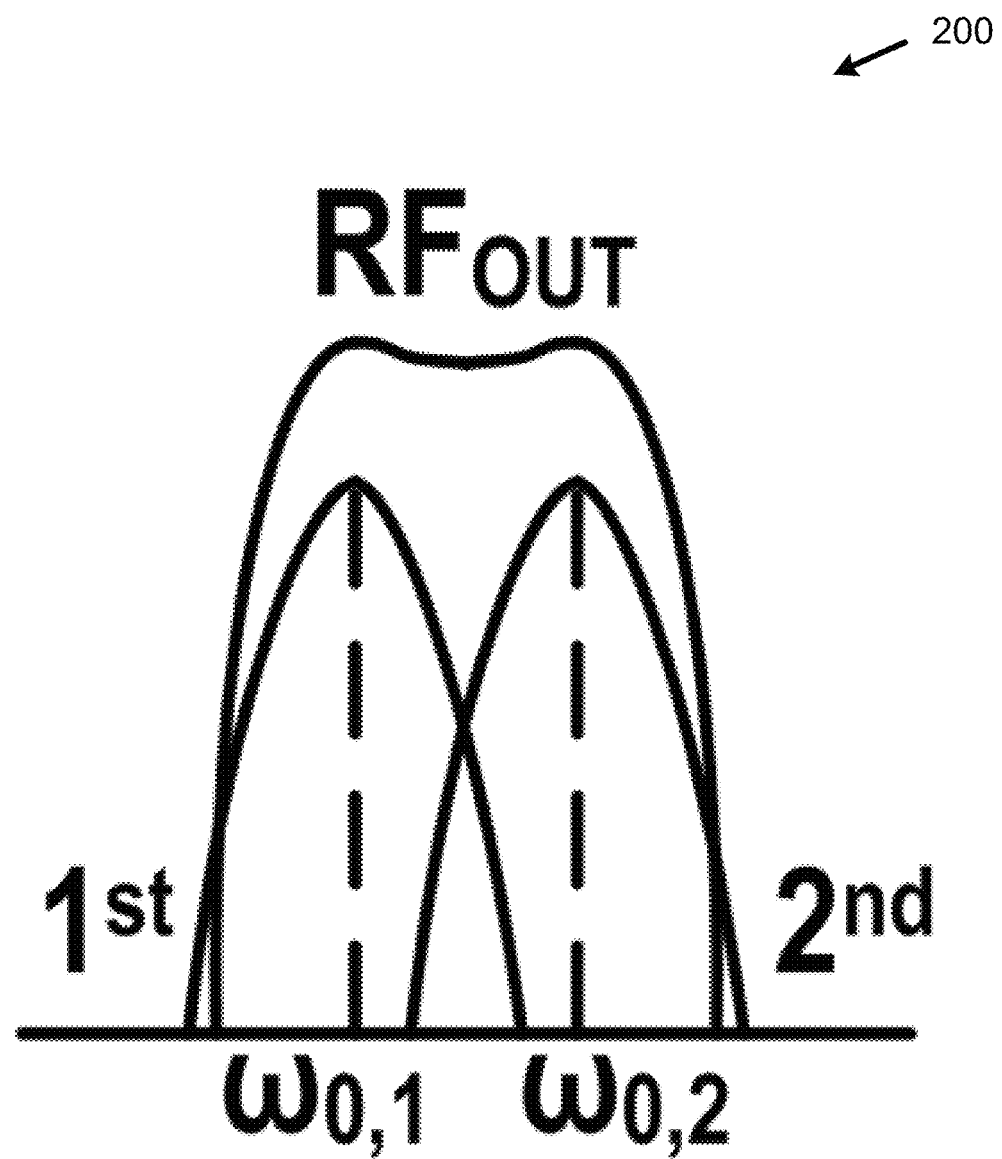
FIG. 2 is an example simplified graph showing a combined resulting frequency response of two cascaded bandpass filters in accordance with some embodiments.

The first and second bandpass filters 104, 106 may be configured together to have a combined bandpass frequency response having a combined channel bandwidth and center frequency. Referring to FIG. 2, it is an example simplified graph 200 showing a combined resulting frequency response of two cascaded bandpass filters and ("$1^{st}$, $2^{nd}$" bandpass filters) in accordance with some embodiments. On the left, a first relatively high Q bandpass response ("$1^{st}$," e.g.,for the first bandpass filter 104 of FIG. 1A) centered around a resonant frequency j is combined with a second relatively high Q bandpass response ("$2^{nd}$," e.g., for the second bandpass filter 106 of FIG. 1A) centered around a resonant frequency $\omega_{0,2}$, resulting in a combined frequency response of "$RF_{OUT}$" The curve for $RF_{OUT}$ shows what would be the combined response of the "$1^{st}$" and "$2^{nd}$" bandpass filters (e.g., as seen at the output of the bandpass filter (e.g., at the second bandpass filter 106)), with a bandpass channel bandwidth roughly between the frequencies of $\omega_{0,1}$ and $\omega_{0,2}$. Such a designed frequency response may generally provide adjacent channel rejection, with a sharp drop off in frequency response on either side of the resonant frequencies of the "$1^{st}$" and "$2^{nd}$" bandpass filters. A center frequency of the combined frequency response $RF_{OUT}$ of the "$1^{st}$" and "$2^{nd}$" bandpass filters may be defined roughly as the midpoint between the resonant frequencies of the "$1^{st}$" and "$2^{nd}$" bandpass filters and may be referred to as the center channel frequency.

In some embodiments, prior to undertaking calibration of the first and second bandpass filters 104, 106 of FIG. 1A, the receiver stage 108 may be calibrated. In some embodiments, calibrating the receiver stage 108 may involve ensuring that the receiver may properly receive and process incoming signal frequencies within a frequency channel, e.g., within a bandpass channel bandwidth expected and desired for signals output from the second bandpass filter 106. In some embodiments, calibrating the receiver stage 108 may at least in part serve to minimize any impact of the receiver stage 108 on any frequency response measured by the FFT module 110. For example, in this way a calibration of the first and/or second bandpass filters 104, 106, separately, or, e.g., together, may be focused on tuning toward a desired frequency response as measured by the FFT module 110 without being impacted by the receiver stage 108. In some embodiments, no calibration of the receiver stage 108 may be performed (or, e.g., needed to be performed) prior to any calibration of the first and second bandpass filters 104, 106. In some embodiments, the receiver stage 108 may be properly configured to receive a very wide bandwidth, e.g., larger than any expected bandpass channel bandwidth, and may safely be assumed to be operating properly with specific calibration prior to any calibration of the first and second bandpass filter 104. In some embodiments, the design of the system 100 including the receiver stage 108 may be configured such that the FFT module 110 is not meaningfully affected during, e.g., a testing mode, by the receiver stage 108 such that the receiver stage 108 would not be calibrated.

In some embodiments, the first and second bandpass filters 104, 106 may be tuned toward a desired bandpass frequency response, e.g., with desired resonant frequency $f_0$, center frequency $f_c$, desired quality factor QF, desired bandwidth, etc., both individually and combined. In some embodiments, calibration of the filters 104, 106 may be performed on both filters 104, 106 simultaneously, while in other embodiments, the filters 104, 106 (or, e.g., N filters) may be calibrated separately, e.g., in any order.

In some embodiments, one or more output values from the FFT module 110 may be used to measure the frequency response of, separately, the first bandpass filter 104 and the second bandpass filter 106. Measuring the frequency response of either the first bandpass filter 104 or the second bandpass filter 106 may be aided by isolating any impact on the signal passing through the filters 104, 106 to the filter being calibrated. In some embodiments, a Q of the bandpass filter that is not under test or not being calibrated is reduced so that the frequency response of that filter is (or approaches) flatband. Meanwhile, this allows, e.g., the bandpass filter that is under test or being calibrated to impact a signal passing through that filter separately and in isolation from any effects from the filter that is not being calibrated.

Specifically, in accordance with some embodiments, to calibrate the first bandpass filter 104, the Q of the second bandpass filter 106 may be lowered to flatband while the calibration on the first bandpass filter 104 is performed. Similarly, to calibrate the second bandpass filter 106, the Q of the first bandpass filter 104 may be lowered to flatband while the calibration of the second bandpass filter 106 is performed. In accordance with these examples, in some embodiments, the order of calibration of the first and second bandpass filters does not matter. In some embodiments, prior to calibrating the first and the second bandpass filters 104, 106, the receiver stage may be calibrated to further limit any impact of non-tested stages on the output values of the FFT module 110 and the FFT measurement.

In some embodiments, a "coarse" calibration may be used prior to a "fine" calibration of the first and second bandpass filters 104, 106. In coarse calibration, in accordance with some embodiments, the bandpass filter under test (e.g., a tank circuit of the bandpass filter) is made to oscillate or driven to oscillation by increasing the Q of the bandpass filter. For example, in some embodiments, a frequency of the bandpass filter may be counted and tuned to set the resonant frequency of the bandpass filter near (or closer to, or more roughly near) the desired center frequency of the bandpass filter.

In some embodiments, a coarse calibration prevents the bandpass filter under test from, e.g., being so far away from the desired center frequency of the bandpass filter that, e.g., the FFT module 110 is unable to properly measure the frequency response of the bandpass filter. This may be avoided in some implementations by performing an initial rough or coarse calibration of the bandpass filter so that it is in an initial usable range to obtain meaningful results (e.g., output values) out of the FFT module 110 for, e.g., subsequent use in the "fine" calibration stage.

In some embodiments, it should be understood that, e.g., range of the bandpass filter under test or the FFT module 110 may not be a design issue and in such case coarse calibration may not be performed or even configured or programmed into a particular design.

In some embodiments, a switchable bit controlled capacitor bank may be used to adjust the resonant frequency of the bandpass filter under test, with, e.g., more significant bits adding more capacitors (or, e.g., higher value capacitors in a bank of unequal capacitor values) to the filter (for "coarse" calibration) to make (relatively) large or larger changes to the resonant frequency, and less significant bits adding fewer capacitors (or, e.g., lower value capacitors in a bank of unequal capacitor values) to the filter (for "fine" calibration) to make (relatively) small or smaller changes to the resonant frequency, providing more precise tuning of the bandpass filter frequency response.

In some embodiments, whether or not "coarse" calibration is performed, a "fine" calibration process may be used. In general, adjusting the Q of the filter under test using the respective quality factor control signal (e.g., $QF_1$ or $QF_2$) for that filter serves to adjust the bandwidth of the filter, while adjusting the frequency (e.g., the resonant frequency) of the filter under test using the respective frequency control signal (e.g., $f_1$ or $f_2$) for that filter serves to shift the 3 dB frequencies of the filter. In some embodiments, an iterative process may be used that provides fine tuning of the quality factor Q of the filter and the resonant frequency Q of the filter to approach a desired frequency response. In some embodiments, tuning may involve using one or more output values of the FFT module 110, e.g., output values at a desired center frequency of the filter under test and at desired lower and upper cutoff frequencies of the filter under test.

In some embodiments, while the order in which the Q and frequency adjustment (e.g., resonant frequency adjustment) does not generally matter, and iteratively or otherwise may occur effectively simultaneously, some simplified conceptual examples may be presented.

According to a first example, at a very simplified high level, a process may begin by comparing FFT output values (e.g., selected from output values from the FFT module 110 and provided to the BPF controller circuit 112) at the desired lower and upper cutoff frequencies with one another. The frequency of the filter may be finely tuned in a direction such that the FFT output values at the desired lower and upper cutoff frequencies become more equal to one another. As, e.g., the FFT output values at the desired lower and upper cutoff frequencies become roughly equivalent, these FFT output values at the desired lower and upper cutoff frequencies may be compared with the FFT output value at the desired center frequency of the bandpass filter under test. The quality factor Q of the filter may be finely tuned in a direction such that the FFT output values at the desired lower and upper cutoff frequencies each approach −3 dB down from the FFT output value at the desired center frequency of the bandpass filter under test.

According to another, second example, at a very simplified high level, a process may begin by comparing FFT output values at the desired lower and upper cutoff frequencies and at the desired center frequency with one another. If the FFT output values are comparable, and the FFT output values at the desired lower and upper cutoff frequencies are not −3 dB down from the FFT output value at the desired center frequency, the Q may be increased until there is a difference between these values. As, e.g., the FFT output values at the desired lower and upper cutoff frequencies approach −3 dB down from the FFT output value at the desired center frequency, the FFT output values at the desired lower and upper cutoff frequencies may be compared with one another and the frequency (e.g., the resonant frequency) of the filter may be finely tuned in a direction such that the FFT output values at the desired lower and upper cutoff frequencies become more equal to one another.

As, e.g., the Q of the bandpass filter is adjusted upward or downward, a gain of the bandpass filter (or a gain of a low-noise amplifier that includes the bandpass filter) may likewise be impacted. In some embodiments, to manage gains in subsequent stages, e.g., in the receiver stage (for example in an analog-to-digital converter (ADC) in the receiver stage 108) the gain may be automatically controlled (e.g., stepped upward or downward). In some embodiments, the BPF controller circuit 112 may include gain adjustment capability, e.g., automatic gain control (AGC) functionality. For example, if the Q is increased, the gain may be stepped automatically downward to, e.g., prevent saturation of transistors in, e.g., an ADC in the receiver stage. As another example, if the Q is decreased, the gain may be stepped automatically upward to, e.g., provide an appropriate level of gain to strengthen the output signal of the bandpass filter to reduce or offset the relative impact of noise at the bandpass filter or in subsequent stages, such as the receiver stage 108.

In some embodiments, as described above, test signal generator 114, e.g., a transmitter, generates a wideband test signal. In some embodiments, the wideband test signal may be centered at a desired center frequency of the bandpass filter under test or that is to be calibrated. In some embodiments, as described above, the wideband test signal may be an OFDM training sequence or signal, made up of, e.g., 56 separate tones or carrier frequencies and having uniform flat unmodulated magnitudes at the 56 separate tones or carrier frequencies. In some embodiments, the OFDM training sequence may be centered at a desired center frequency of the bandpass filter under test. The desired center frequency is known to, e.g., the designer since this desired center frequency is part of the ultimate combined channel frequency and bandwidth of the combined bandpass response of the bandpass filters, e.g., the first and second bandpass filters 104, 106. See, e.g., FIG. 2. In some embodiments, as the bandpass filter under test is calibrated, e.g., by adjusting Q and/or the center frequency (e.g., by way of modifying the resonant frequency), the wideband test signal will continue to be generated (and, e.g., transmitted) being centered at the desired center frequency of the bandpass filter. In this way, the bandpass filter under test may be tuned to approach a desired frequency response, centered at the desired center frequency and at the desired bandwidth and quality factor Q.

Figure 1B:
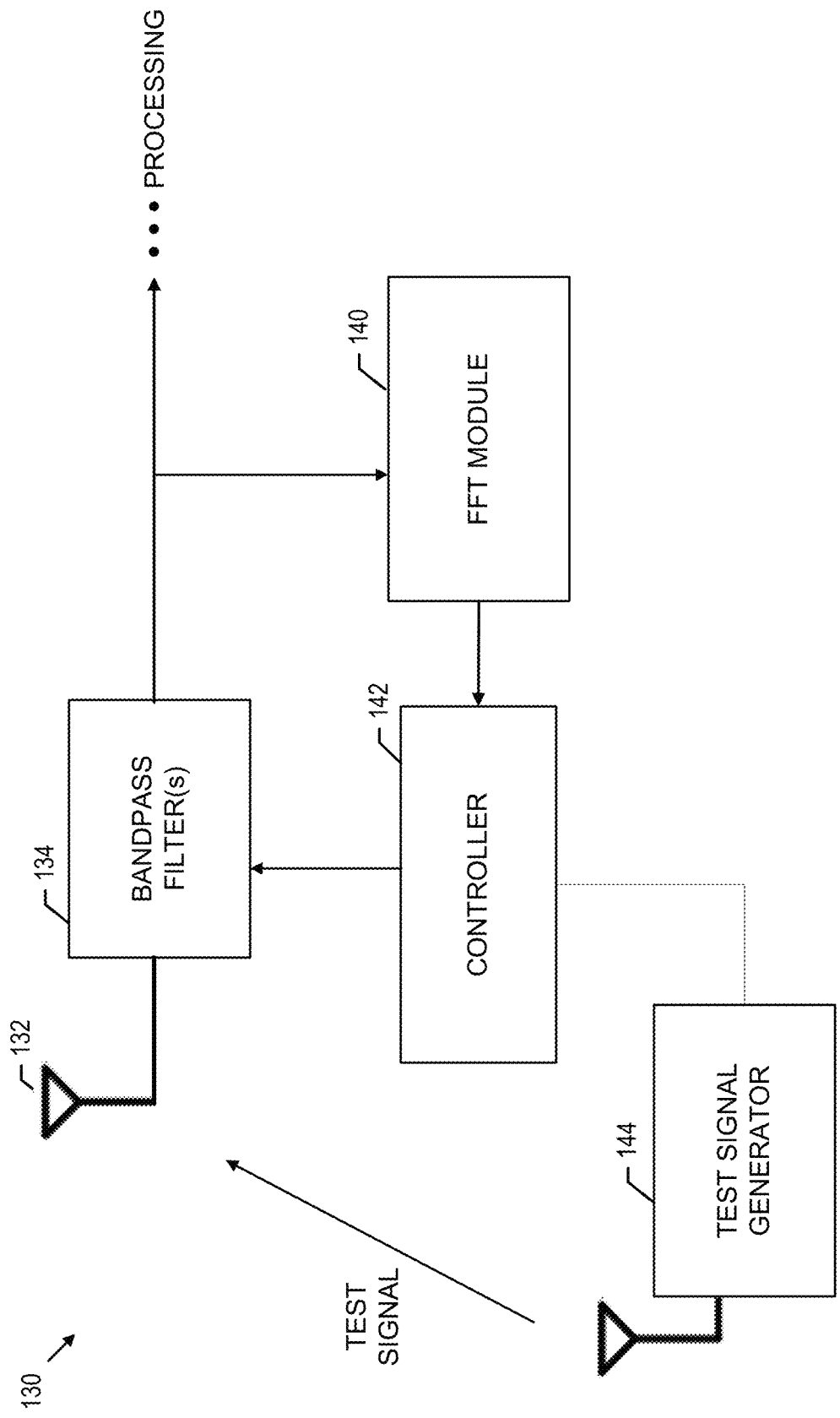
FIG. 1B is a block diagram of an example bandpass filter calibration system in accordance with some embodiments.

Referring now to FIG. 1B, it is a block diagram of an example bandpass filter calibration system 130 in accordance with some embodiments. The example bandpass filter calibration system 130 is shown for illustrative purposes as an even further generalized example calibration system. The system 130 of FIG. 1B may, in some embodiments, operate similarly to the bandpass filter calibration system 100 of FIG. 1A, but the system 130 shows more explicitly that the bandpass calibration system 130 may include and may calibrate a single bandpass filter 134 or multiple bandpass filters 134, that is, the bandpass filter(s) 134 may be generally N bandpass filter(s) where N≥1. For further generalization and clarity a receiver stage (such as, e.g., the receiver stage 108 of FIG. 1A) is not shown, but may be included in such a system 130. More generally, one or more of the N (where N>1) bandpass filter(s) 134 may be located before a receiver stage (not shown in FIG. 1B), one or more of the N (where N≥1) bandpass filter(s) 134 may be part of a receiver stage, or, e.g., one or more of the N (where N≥1) bandpass filter(s) 134 may be located after a receiver stage.

In example operation of the system 130 of FIG. 1B, a signal, e.g., a modulated signal is received at an antenna 132 (e.g., antenna 102 of FIG. 1A) and input to a bandpass filter (of bandpass filter(s) 134)), e.g., a tunable bandpass filter. As applied to the bandpass filter calibration system 100 of FIG. 1A, bandpass filter(s) 134 of FIG. 1B may be, e.g., bandpass filter 104 (N=1), bandpass filter 106 (N=1), or may represent bandpass filters 104, 106 (N=2, according to the example). In some embodiments, an analog output from the bandpass filter(s) 134 may be input to a receiver stage (not shown, such as receiver stage 108). It will be understood that any variety of receiver and demodulation designs (e.g., polar to rectangular coordinates, rectangular to polar coordinates, other coordinate systems, rectangular coordinates only, etc.) may be used with the example calibration system 130. Regardless of the particular coordinate mapping or modulation scheme that may be used, e.g., following bandpass filter(s) 134, e.g., digital output values (such as, e.g., from a receiver stage, e.g., on way to further processing) may be input to an FFT module 140 (such as, e.g., FFT module 110 of FIG. 1A), which provides, e.g., amplitude or power magnitudes for frequency components across a defined frequency spectrum. In some embodiments, at least some output values from the FFT module 140 are provided to a controller 142 (such as, e.g., BPF controller circuit 112 of FIG. 1A). The controller 142 may use one or more FFT output values of the FFT module 140 to calibrate the frequency response of one or more of the bandpass filter(s) 134 (such as, e.g., one or more of bandpass filters 104, 106, etc. of FIG. 1A) using, e.g., control input(s) (such as quality factor and frequency control inputs, not shown) to the bandpass filter(s) 134, e.g., as described with respect to FIG. 1A.

Continuing to refer to system 130 of FIG. 1B, the controller 142 may control a test signal generator 144 such as, e.g., test signal generator 114 of FIG. 1A (e.g., during at least a testing mode) to generate one or more test signals, such as a wideband test signal, and as described above with respect to FIG. 1A. A test signal generated by the test signal generator 144, e.g., during a testing mode, may go in directly to the bandpass filter(s) 134 (e.g., through via an intermediate stage or otherwise as appropriate), or, in, e.g., as in some embodiments in which the test signal generator 144 is a transmitter, a test signal may more generally be transmitted through the air and received at antenna 132 for processing in, e.g., one or more of the bandpass filter(s) 134, and so on through to the FFT module 140. In some embodiments, the test signal generator 144 is a local transmitter to the bandpass filter(s) 134 and the antenna 132. In some embodiments, the test signal generator 144 (e.g., a transmitter) is configured to transmit, e.g., modulated signals during a regular operating mode and is further configured to transmit a test signal during, e.g., a testing mode. Example operation of the bandpass filter calibration system 130 of FIG. 1B may proceed, e.g., in some embodiments, in accordance with examples discussed with respect to the bandpass filter calibration system 100 of FIG. 1A.

Figure 1C:
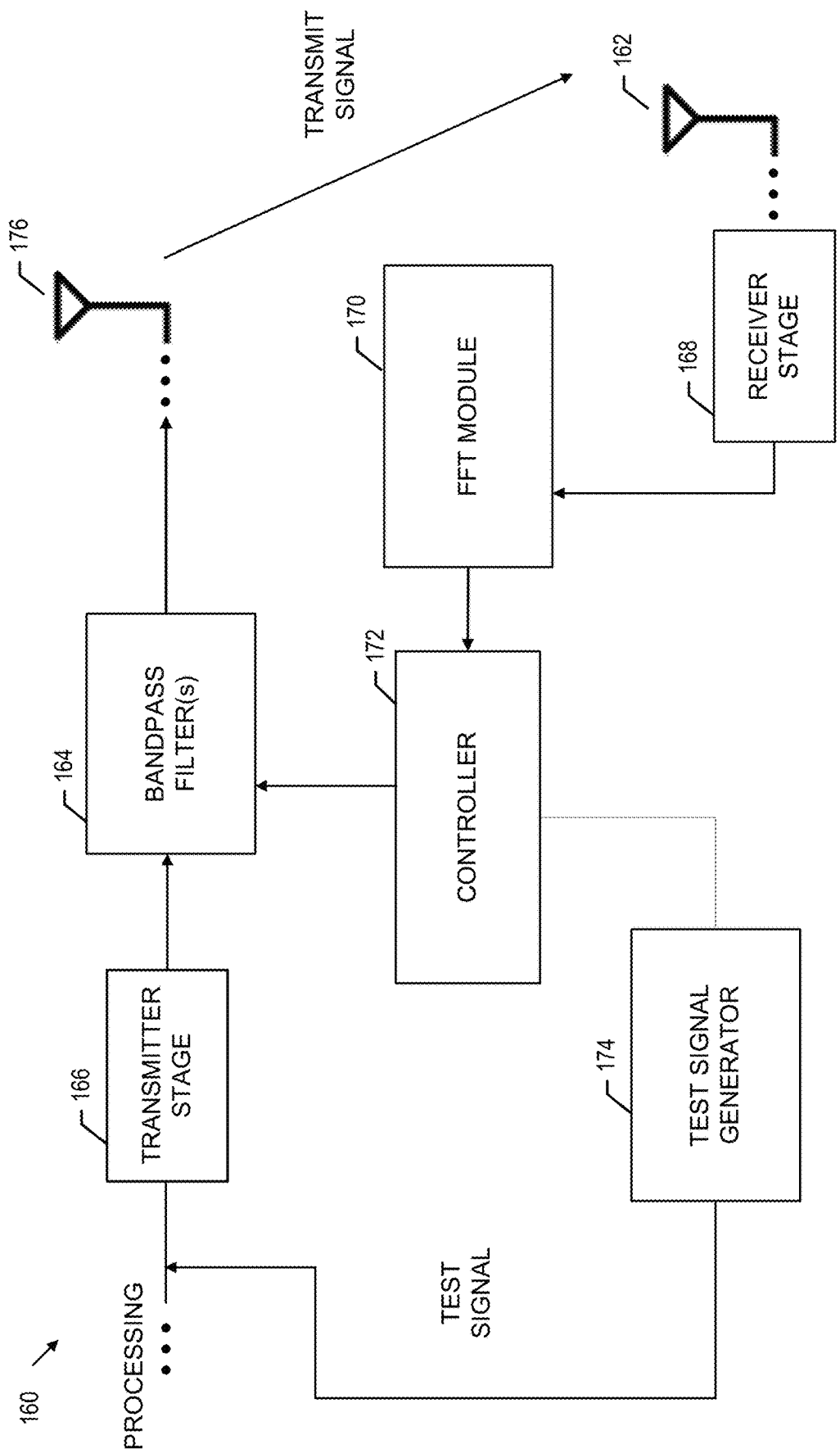
FIG. 1C is a block diagram of an example bandpass filter calibration system for an example transmitter in accordance with some embodiments.

Referring now to FIG. 1C, it is a block diagram of an example bandpass filter calibration system 160 for an example transmitter in accordance with some embodiments. The example bandpass filter calibration system 160 is shown for illustrative purposes as a generalized example calibration system from a transmitter perspective. The system 160 of FIG. 1C may, in some embodiments, and from a bandpass filter calibration perspective, operate similarly to the bandpass filter calibration system 100 of FIG. 1A, even though the bandpass filter(s) may be in a transmit path rather than, e.g., a receive path. In these respects, the system 160 is intended to show more explicitly that the bandpass calibration system 160 may include and may calibrate a single bandpass filter 164 or multiple bandpass filters 164, that is, the bandpass filter(s) 164 may be generally N bandpass filter(s) where N≥1. In the example system 160 a transmitter stage 166 is shown in a transmit path shown to more clearly distinguish from a receive path that includes, e.g., a receiver stage 168. More generally, one or more of the N (where N≥1) bandpass filter(s) 164 may be located before the transmitter stage 166, one or more of the N (where N≥1) bandpass filter(s) 164 may be part of the transmitter stage 166, or, e.g., one or more of the N (where N≥1) bandpass filter(s) 164 may be located after the transmitter stage (for example as shown in FIG. 1C). The transmitter stage 166 may include, e.g., one or more digital power amplifiers.

In example operation of the system 130 of FIG. 1C, a signal, e.g., a signal modulation prior to transmission, arrives from processing at (e.g.) the transmitter stage 166 and is input to a bandpass filter (of bandpass filter(s) 164)), e.g., a tunable bandpass filter. As applied to the bandpass filter calibration system 100 of FIG. 1A, bandpass filter(s) 164 of FIG. 1C may be, e.g., bandpass filter 104 (N=1), bandpass filter 106 (N=1), or may represent bandpass filters 104, 106 (N=2, according to the example). A filtered modulated signal may be output from the bandpass filter(s) 164 and transmitted at antenna 176. In some embodiments, an antenna 162 (e.g., a local antenna) may receive the signal transmitted by antenna 176 and the received modulated signal may proceed through the receiver stage 168 and be input (e.g., via a receive path) to an FFT module 170 (such as, e.g., FFT module 110 of FIG. 1A), which provides, e.g., amplitude or power magnitudes for frequency components across a defined frequency spectrum. In some embodiments, at least some output values from the FFT module 170 are provided to a controller 172 (such as, e.g., BPF controller circuit 112 of FIG. 1A). The controller 172 may use one or more FFT output values of the FFT module 170 to calibrate the frequency response of one or more of the bandpass filter(s) 164 (such as, e.g., one or more of bandpass filters 104, 106, etc. of FIG. 1A) in the transmit path using, e.g., control input(s) (such as quality factor and frequency control inputs, not shown) to the bandpass filter(s) 164, e.g., as described with respect to FIG. 1A.

Continuing to refer to system 160 of FIG. 1C, the controller 172 may control a test signal generator 174 such as, e.g., test signal generator 114 of FIG. 1A (e.g., during at least a testing mode) to generate one or more test signals, such as a wideband test signal, and as described above with respect to FIG. 1A. A test signal generated by the test signal generator 174, e.g., during a testing mode, may go to the transmit path directly via the transmitter stage 166 as shown in FIG. 1C or more directly to the bandpass filter(s) 164. Example operation of the bandpass filter calibration system 160 of FIG. 1C may proceed, e.g., in some embodiments, and from a bandpass filter calibration perspective, in accordance with examples discussed with respect to the bandpass filter calibration system 100 of FIG. 1A.

Generally, the example systems 130, 160 of FIGS. 1B and 1C are provided to further illustrate that example techniques described herein in accordance with some embodiments may be used in any system (e.g., a receiver, and transmitter, a transceiver system) having, e.g., an FFT module and a test signal source (such as a test signal generator) to calibrate (e.g., using a controller) one or more bandpass filters.

Figure 3:
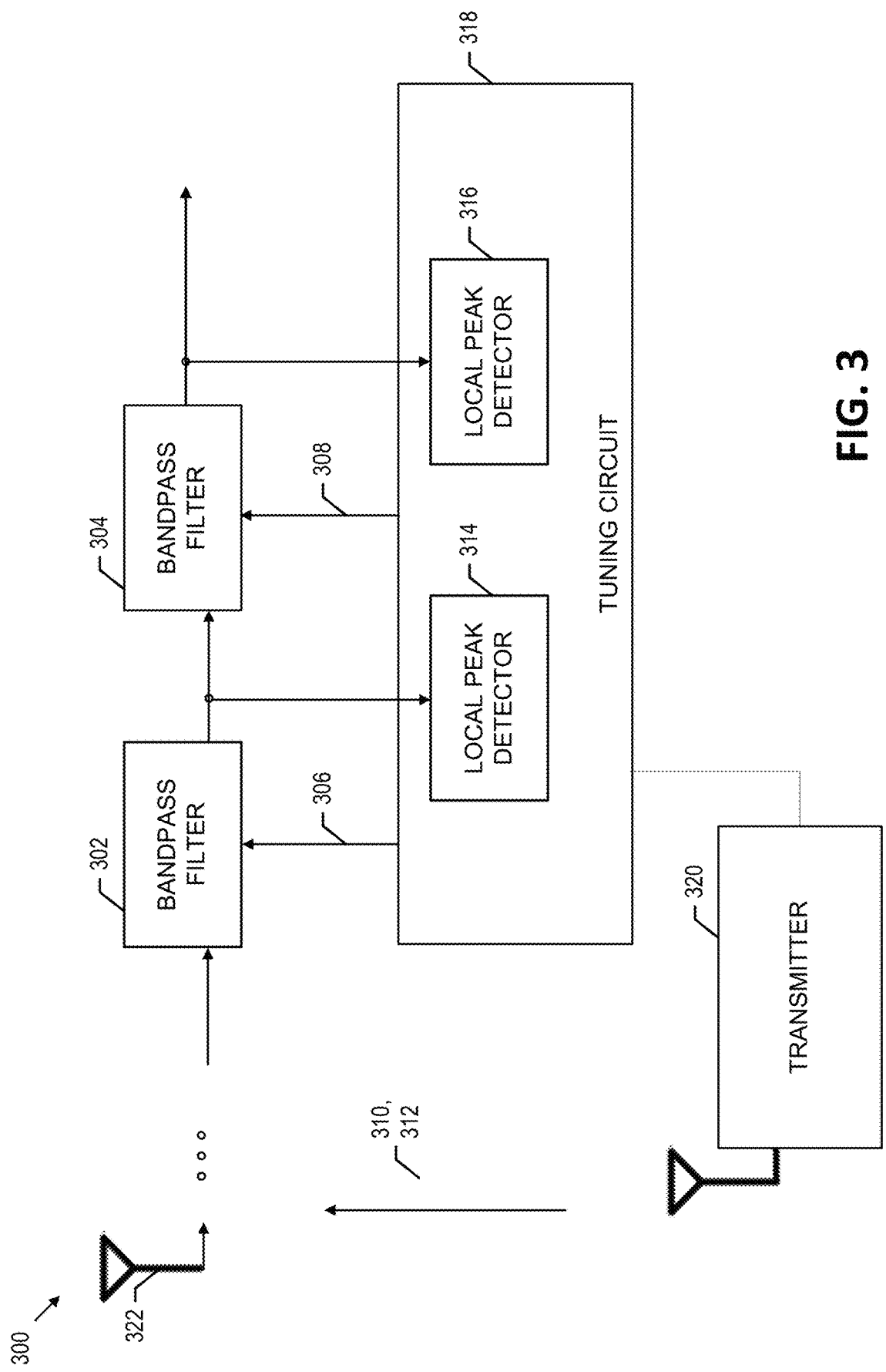
FIG. 3 is a block diagram of an example simplified and partial bandpass filter calibration system for comparison purposes in accordance with some embodiments.

Referring now to FIG. 3, it is a block diagram of an example simplified and partial bandpass filter calibration system 300 for comparison purposes in accordance with some embodiments. Two bandpass filters 302, 304 are cascaded with one another to receive an analog signal from, e.g., an antenna (not shown). The filters 302, 304 receive respective control inputs 306, 308, and receive sets of test signals 310, 312, e.g., respectively and separately at an antenna 322 or otherwise at respective test signal inputs (not shown) to the filters 302, 304, and further provide output signals to local peak detectors (LPDs) 314, 316 at respective outputs of the filters 302, 304. A tuning circuit 318 examines, and tunes the filters 302, 304 based on results from the local peak detectors 314, 316, and further controls a transmitter 320 to send the sets of test signals 310, 312 to the filters 302, 304, respectively and separately at the antenna 322 or, e.g., at respective test signal inputs (not shown) of the filters 302, 304. The order of tuning of the filters 302, 304 does not matter. The tuning of filters 302, 304 may follow a coarse calibration process for each filter 302, 304.

During testing of filter 302, the transmitter 320 sends (as the set of test signals 310) three separate and consecutive test signals 310a, 310b, 310c to filter 302 (e.g., via antenna 322) and the output of filter 302 is monitored by the local peak detector 314. The three consecutive test signals 310a, 310b, 310c successively making up set of signals 310 are each generated at a single frequency apiece, with one signal at a center frequency, another signal at a lower −3 dB point frequency and the other signal at a higher −3 dB point frequency for the filter 302. The signals 310a, 310b, 310c are sent one after the other, not simultaneously.

Then, during testing of filter 304, the transmitter 320 sends (as the set of test signals 312) three separate and consecutive test signals 312a, 312b, 312c to filter 304 (e.g., via antenna 322) and the output of filter 304 is monitored by the local peak detector 316. The three consecutive test signals 312a, 312b, 312c successively making up set of signals 312 are each generated at a single frequency apiece, with one signal at a center frequency, another signal at a lower −3 dB point frequency and the other signal at a higher −3 dB point frequency for the filter 304. The signals 312a, 312b, 312c are sent one after the other, not simultaneously.

One example calibration process using consecutive, single-tone signals, using local amplitude detectors is as follows:

Calibrate first filter (e.g., filter 302)
[perform coarse calibration on first filter]
send test signal 310a at a single first tone (e.g., at center frequency)
analyze output of LPD 314
send test signal 310b at a single second tone (e.g., at a lower −3 dB point frequency)
analyze output of LPD 314
send test signal 310c at a single third tone (e.g., at a higher −3 dB point frequency)
analyze output of LPD 314
compare outputs of LPD 314
tune filter 302
repeat until filter 302 calibrated
Calibrate second filter (e.g., filter 204)
[perform coarse calibration on second filter]
send test signal 312a at a single first tone (e.g., at center frequency)
analyze output of LPD 316
send test signal 312b at a single second tone (e.g., at a lower −3 dB point frequency)
analyze output of LPD 316
send test signal 312c at a single third tone (e.g., at a higher −3 dB point frequency)
analyze output of LPD 316
compare outputs of LPD 316
tune filter 304
repeat until filter 304 calibrated The example calibration process is an effective technique to tune, e.g., cascaded bandpass filters.

Nonetheless, as can be seen from the sample description, tuning of the filters 302, 304 can take valuable processing time, relatively speaking, for the transmitter 320 (in the case of a transmitter including, e.g., a phase locked loop) to lock on a particular frequency tone to generate a particular test signal and to successively send the test signals to the filter 302, 304 being tuned (e.g., via antenna 322).

In addition, comparing measured responses of the filters 302, 304 to the successive test signals can be (relatively) time consuming (and perhaps somewhat less efficient, in some cases, depending on the implementation) because the local peak detectors 314, 316 (only) measure signal power in response to a test signal sent at (in this case) a single tone at a single time. Further, having to generate a separate test signal for each potential frequency of interest, to send the separate signals one after the other, and determine and examine separate individual results respectively for each potential frequency of interest one after the other may present challenging issues in trading off accuracy of filter tuning versus power consumption and processing time. That is, if further accuracy is desired, in a single frequency per single test signal design, each additional analysis frequency may mean an additional test signal for each filter under test.

In addition, generating and sending individual test signals having singular tones through the air may be impermissible at certain frequencies of operation under certain wireless and government (e.g., U.S. Federal Communications Commission (FCC)) regulations and certain scenarios, unless sent below, e.g., a certain power threshold.

Figures 4A, 4B:
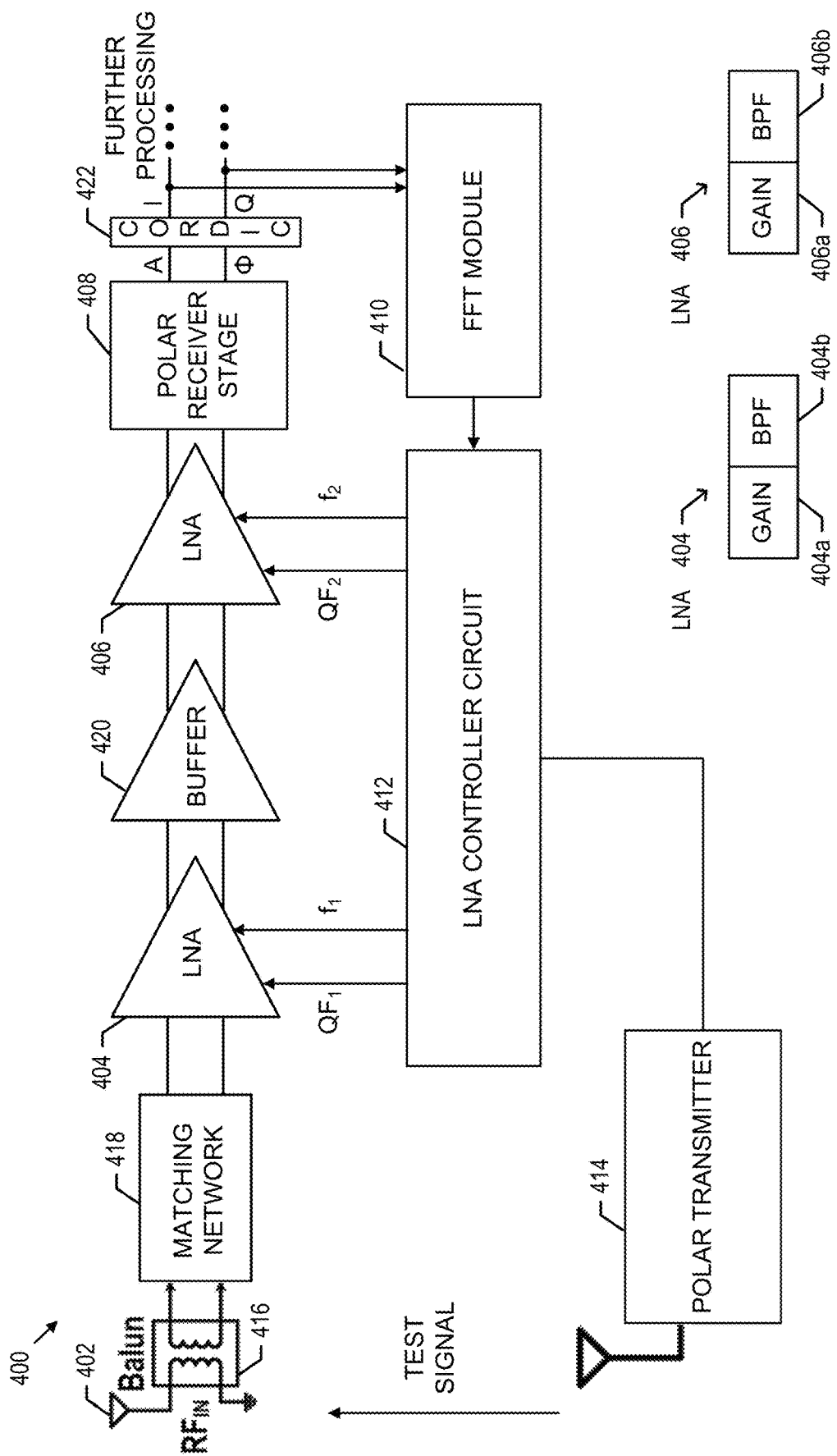
FIG. 4A is a block diagram of an example low-noise amplifier calibration system in accordance with some embodiments.
FIG. 4B is a diagram showing two example low-noise amplifier stages from FIG. 4A in accordance with some embodiments.

In, e.g., the example bandpass filter calibration system 100 described in FIG. 1A, the example bandpass filter calibration system 130 of FIG. 1B, the example bandpass filter calibration system 170 of FIG. 1C, and the example low-noise amplifier calibration system 400 described with respect to FIG. 4A in accordance with some embodiments, one or more features may be included.

FFT Module

In some embodiments, output values from an FFT module may be used to tune individual bandpass filters, or individual low-noise amplifiers. In the example system 300 of FIG. 3, local peak detectors 314, 316 are used at the output of each bandpass filter 306, 308. Using an FFT module captures a far wider range of frequency components of a frequency response than, e.g., a local peak detector monitoring an output of a bandpass filter stage. In some embodiments, a controller circuit (e.g., a BPF or LNA/BPF controller circuit) may use three to six output values of an FFT module. Nonetheless, depending on a particular implementation an FFT module may generally output a wide number of values than, e.g., three to six values and thus presents additional values that may be used if an even more accurate estimate and calibration (e.g., trading off against increased calibration time) is desired in accordance with some embodiments.

Multiple Frequencies in a Single Test Signal

In some embodiments, a test signal may be a multi-tone signal having multiple frequency components in the same signal, such as a wideband test signal. Using a test signal with multiple frequencies in the same signal (rather than, e.g., a test signal with only a single frequency), in accordance with some embodiments, may reduce a number of test signal transmissions, may mean reduce overall timing of signal generation in that a test signal generator such as a transmitter may not need to "lock" on separate frequencies in consecutive signals. In some embodiments, when a multiple frequency test signal is used in conjunction with an FFT module, the FFT module may provide signal magnitudes for the separate frequency components in the single test signal. In the example system 300 of FIG. 3, analyzing a frequency response at N frequencies meant N test signals sent N times. In the example systems 100, 400 of FIGS. 1A and 4, respectively (or, e.g., systems 130, 160 of FIGS. 1B and 1C, respectively), in accordance with some embodiments, a test signal may include M frequencies in the same signal, where M≥N, such that the test signal may be sent one time with M frequencies, and, with use of an FFT module having a range that encompasses the M frequencies, N or M FFT output values may be used in bandpass filter calibration.

In some embodiments, the wideband test signal may be an OFDM training sequence having multiple (e.g., 56) unmodulated tones.

In some embodiments, a multiple tone test signal such as an OFDM training sequence that is permitted by regulations (e.g., FCC regulations) regarding transmit power may be contrasted with transmission of a test signal that has a single tone. It may be the case in some designs that transmission of a single tone signal may be prohibited at some transmission power.

Reducing a Quality Factor of Non-Tested Filter(s) or LNA Stage(s) During Testing In some embodiments, in a two bandpass filter system, for example, or a two LNA system, a quality factor of a filter or LNA stage not being tested may be reduced such that a frequency response of the non-tested filter or LNA stage approaches flatband, or a flat response. Flattening the frequency response of the non-tested stage helps ensure that an FFT module is better able to estimate a frequency response of the stage that is current under test. In some embodiments, other circuit blocks between the LNA stages and the FFT module (e.g., a receiver stage) may be calibrated, e.g., prior to testing, to improve estimation of the frequency response out of the FFT module for the filter stage (bandpass filter or LNA stage including a bandpass filter) under test.

Referring now to FIG. 4A is a block diagram of an example low-noise amplifier calibration system 400 in accordance with some embodiments. The low-noise amplifier calibration system 400 is an example implementation, in accordance with some embodiments, of the more general bandpass filter calibration system 100 of FIG. 1A (which is, e.g. a special case of the even more general bandpass filter calibration system 130 of FIG. 1B, and it should be understood that aspects of the low-noise amplifier calibration system may be applied to the example bandpass filter calibration system 170 of FIG. 1C, as appropriate). FIG. 4B is a diagram showing two example low-noise amplifier stages from FIG. 4A in accordance with some embodiments. Some example system blocks and example circuits are presented, solely for purposes of explanation and not limitation.

A signal, e.g., a modulated signal, is received at an antenna 402 and a balun 416 and is further received at a matching network 418. In some embodiments, the matching network 418 may be a wideband low-noise amplifier (LNA or LNA stage) 418 which may amplify the modulated signal and provide impedance matching to the antenna 402. The signal is further input to a first LNA stage 404 and then (e.g., by way of buffer 420) to a second LNA stage 406. The LNA stages 404, 406, generally include respective bandpass filters (BPFs) 404b, 406b, e.g., tunable bandpass filters. The LNA stages 404, 406 may include (see FIG. 4B) gain stages 404a, 406a, e.g., variable gain stages. Although two LNA stages are shown cascaded together following the matching network 418 (which may itself be an LNA), generally any number of LNA stages may be used, e.g., N stages (or, N−1 stages not counting, e.g., the initial LNA 418). In some embodiments, and as shown in FIG. 4A, one or more buffers (e.g., buffer 420) may be used through the chain of elements, between LNA stages, following the matching network 418, or between the second LNA stage 406 and the polar receiver stage 408. An amplified analog signal is output from the second LNA stage 406 and is input to, e.g., a polar receiver stage 408, e.g., a polar receiver demodulation stage.

In the example calibration system 400 shown in FIG. 4A, polar receiver stage 408 recovers, e.g., phase and amplitude from the amplified analog signal and outputs digital signals (e.g., digital bit sequences) in polar coordinates amplitude sample $A_i$ ("A") and phase samples $\phi_i$ ("φ"). The amplitude and phase digital signal outputs are converted to I and Q (in-phase and quadrature) digital baseband outputs or digital bit output sequences by CORDIC 422. Although a polar receiver stage 408 and a polar to rectangular conversion is shown in FIG. 4A, it will be understood that any variety of receiver and demodulation designs may be used with the example calibration system 100.

The I and Q values may separately be used in further processing (e.g., digital signal processing, e.g., further demodulation or modulation designs). In some embodiments, the I and Q baseband data may be further processed for decoding and/or conditioning using techniques known the art from processing digital data.

Regardless of that particular scheme used (e.g., here polar to rectangular coordinate conversion) digital output values (here I and Q values) from the polar receiver stage 408 and CORDIC 422 are input to a Fast Fourier Transform (FFT) module 410, which provides, e.g., amplitude or power magnitudes for frequency components across a defined energy spectrum. In some embodiments, the FFT module 410 is part of a digital baseband block that may be used in further demodulation or in a modulation design (not shown). In some embodiments, at least some output values from the FFT module 410 are provided to an LNA controller circuit 412, e.g., a calibration controller circuit. The LNA controller circuit 412 may use one or more FFT output values of the FFT module 410 to calibrate the frequency response of one or more of the first and second bandpass filters 404b, 406b of the first and second LNA stages 404, 406, respectively, using, e.g., control inputs to the first and second LNA stages 404, 406. Gain control inputs may also be used by the LNA controller circuit to adjust and control gain of the gain stages 404a, 404b (see FIG. 4B) of the first and second LNA stages 404, 406 respectively during, e.g., frequency response calibration of the LNA stages 404, 406.

The LNA controller circuit 412 may control (or partially control) a test signal generator such as a polar transmitter 414 (e.g., during at least a testing mode) to generate one or more test signals, such as a wideband test signal. A test signal generated by the polar transmitter 414, e.g., during a testing mode, may generally be transmitted through the air and received at antenna 402 and balun 416 for amplification in the matching network 418 or wideband LNA 418, and for eventual processing in, e.g., the first LNA stage 404 and the second LNA stage 406, and so on through to the FFT module 410. In some embodiments, the polar transmitter 414 is a local transmitter to the LNA stages 404, 406 and the antenna 402. In some embodiments, the polar transmitter 414 is configured to transmit, e.g., modulated signals during a regular operating mode and is further configured to transmit a test signal during, e.g., a testing mode.

In some embodiments, as shown in FIG. 4A, the first bandpass filter 404b of the first LNA stage 404 receives control inputs $QF_1$ and $f_1$, and the second bandpass filter 406b of the second LNA stage 406 receives control inputs $QF_2$ and $f_2$. The control inputs $QF_1$ and $QF_2$ and $f_1$ and $f_2$ respectively represent quality factor ("QF," "Q") and frequency control inputs for the bandpass filters 404b, 406b of the LNA stages 404, 406 that may permit tuning of the bandpass filters 404b, 406b.

Example operation in accordance with some embodiments of the control inputs, the calibration of the BPFs of the LNA stages 404, 406, based on at least some input from the FFT module 410 in response to a test signal, e.g., a wideband test signal, such as the OFDM training sequence is generally discussed above with respect to the example bandpass filter calibration system 100 of FIG. 1A.

In some embodiments, certain example circuits for some of the processing and circuit blocks in the example LNA calibration system of FIG. 4A may be used.

Referring to polar transmitter 414, some example implementations of polar transmitters may be found in, e.g., U.S. Pat. No. 9,985,638, issued May 29, 2018, entitled "WIDEBAND DIRECT MODULATION WITH TWO-POINT INJECTION IN DIGITAL PHASE LOCKED LOOPS," the entirety of which is incorporated herein by reference; and U.S. Pat. No. 10,148,230, issued Dec. 4, 2018, entitled "ADAPTIVE DIGITAL PREDISTORTION FOR POLAR TRANSMITTER," the entirety of which is incorporated herein by reference. It will be understood of course that other transmitter (e.g., polar transmitter or non-polar transmitter) architectures may be used.

Referring again to FIG. 4A, in some embodiments, a signal, e.g., a modulated signal, may be received, e.g., during an operating mode, at the antenna 402 and the balun 416 and then further received at the matching network 418 (e.g., a wideband LNA that, e.g., amplifies the signal) prior to the LNA stages 404, 406.

In some embodiments, the signal may be a modulated radio-frequency signal with, e.g., a variable phase component. According to an example in accordance with some embodiments, the modulated radio-frequency signal. In some embodiments, the (e.g., modulated) radio-frequency signal, whether incoming or outgoing, whether being transmitted or received, may be implemented as a modulated carrier signal, has a frequency in the range of 2412 MHz-2484 MHz, although, as will be understood and appreciated, the use of modulated signals in conjunction with, e.g., the calibration systems 100, 130, 160, 300, or 400 are not limited to that frequency range, nor are they limited to radio-frequencies. In general, a polar transmitter and/or transceiver in accordance with some of the embodiments disclosed herein may be used at any suitable frequency. Some particular frequency bands and ranges include those for LTE (4G) (e.g., 700 MHz-6 GHz), 5G (e.g., 600 MHz-6 GHz, 24-86 GHz), and any applicable frequency bands for standards such as LTE, GSM, WiMax and WiFi 802.11 standards (e.g., 2.4 GHz, 5 GHz, 900 MHz), although it will be understood that any frequency may be used in accordance with a particular implementation.

In some embodiments, the receiver stage 408 following the LNA path operates to receive and decode frequency modulated or phase-modulated radio-frequency signals, such as signals modulated using phase shift keying (PSK) or quadrature amplitude modulation (QAM). As the term is used in the present disclosure, phase-modulated signals include signals that are modulated in phase (e.g., binary phase-shift keying, quadrature phase-shift keying, 8-PSK, or 16-PSK) as well as signals that are modulated in both phase and amplitude (e.g., 16-QAM, 64-QAM, or 256-QAM). Frequency modulated signals include, among others, frequency shift keying (FSK) signals such as binary frequency-shift keying (BFSK) signals, multiple frequency-shift keying (MFSK) signals, and minimum-shift keying (MSK) signals.

While some of the embodiments described herein refer to the demodulation of phase-modulated (PM) signals, it should be noted that the disclosed embodiments can also be used to demodulate frequency-modulated (FM) signals, based on the mathematical relationship between changes in frequency and changes in phase. Both phase-modulated and frequency-modulated signals are modulated signals that have a variable phase component.

Referring to receiver stage 408 of FIG. 4A, it should be understood that in some embodiments, a "receiver" such as a polar receiver may include, e.g., the LNA stage(s), a CORDIC, any variety of other functions or circuit blocks. Some example implementations of polar receivers may be found in, e.g., U.S. Pat. No. 10,158,509, issued Dec. 18, 2018, entitled "METHOD AND APPARATUS FOR POLAR RECEIVER WITH PHASE-AMPLITUDE ALIGNMENT," the entirety of which is incorporated herein by reference; and U.S. Pat. No. 9,673,828, issued Jun. 6, 2017, entitled "WIDEBAND POLAR RECEIVER ARCHITECTURE AND SIGNAL PROCESSING METHODS," the entirety of which is incorporated herein by reference; and U.S. Pat. No. 9,673,829, issued Jun. 6, 2017, entitled "WIDEBAND POLAR RECEIVER ARCHITECTURE AND SIGNAL PROCESSING METHODS," the entirety of which is incorporated herein by reference. It will be understood of course that other receiver (e.g., polar receiver or non-polar receiver) architectures may be used.

In some embodiments, the polar receiver stage 408 may include an amplitude path and a phase path to process (after amplification in filtering by the LNA stages 404, 408) an analog signal such as a modulated radio-frequency signal. In some embodiments, the amplitude path may provide a digital signal representing the amplitude of the modulated radio-frequency signal (using, e.g., an analog-to-digital converter (ADC) somewhere in the amplitude path); while the phase path may provide a digital signal that represents a phase (e.g., a current phase) of the modulated radio-frequency signal (using, e.g., in some embodiments, a circuit such as a time-to-digital converter (TDC) somewhere in the phase path). The digital amplitude and phase signals may be provided to CORDIC 442 to identify the I and Q components to be provided to the FFT module 410. In some embodiments, the identified I and Q components (e.g., used (in, e.g., operating mode) to identify a particular symbol, e.g., a quadrature amplitude modulation (QAM) symbol, conveyed by the modulated radio-frequency signal) may be processed (e.g., in a baseband stage) and/or analyzed to demodulate the received signal, as will be understood and appreciated.

In the example shown in FIG. 4A and in accordance with some embodiments, the LNA stages 404, 406 are in a single, serial, path. In other embodiments, after, e.g., amplification by the wideband LNA 418, multiple (e.g., three) parallel band-specific LNA paths (not shown) may be used to further amplify the received signal along one or more of the multiple paths. According to these examples, each band-specific LNA path may include a respective set of LNA stages 404, 406 that may together have a relatively high gain around a selected center frequency and combined bandwidth and a relatively lower gain at other frequencies, allowing each amplifier path to provide bandpass filter functionality in addition to amplification, and that may be separately calibrated. Some example frequency bands for, e.g., multiple band-specific LNA paths may include, e.g., frequencies from 800 MHz to 1.6 GHz, frequencies from 1.6-3.2 GHz, and frequencies from 3.2-6.4 GHz. Examples of band-specific LNA paths are included in, e.g., U.S. Pat. No. 9,673,828, issued Jun. 6, 2017, entitled "WIDEBAND POLAR RECEIVER ARCHITECTURE AND SIGNAL PROCESSING METHODS," the entirety of which is incorporated herein by reference.

In some embodiments according to some example implementations, the bandpass filters 404b, 406b of the cascaded LNA stages 404, 406 of FIG. 4A may face issues of mutual coupling due to the inductors in the, e.g., high-gain LC tanks of each of the two bandpass filters. In some embodiments, for example, inductor isolation structures (e.g., using metallization walls) or special inductive coil designs offset relative to one another (e.g., "figure-8" patterned inductors separately spaced and positioned orthogonal to one another), or both, may be used to mitigate or otherwise reduce mutual inductive coupling. Example techniques and implementations for reducing mutual coupling of these inductors in the LC tanks are described in further detail in U.S. Pat. No. 9,813,033, issued Nov. 7, 2017, entitled SYSTEM AND METHOD FOR INDUCTOR ISOLATION, the entirety of which is incorporated herein by reference; and in U.S. patent application Ser. No. 16/125,480, filed Sep. 7, 2018, entitled MULTI-STAGE LNA WITH REDUCED MUTUAL COUPLING, the entirety of which is incorporated herein by reference.

The output of the cascaded LNA stages is further processed in a receiver, such as a polar receiver 408 of FIG. 4A. Each stage of the two LNA stages 404, 406 includes a tunable bandpass filter 404b, 404b and each may be tuned to exhibit a bandpass response The two center frequencies, one from each tunable bandpass filter of each LNA stage, respectively, may, in some embodiments, be offset to provide an overall wider frequency bandwidth, yet still providing a high degree of off-band selectivity so as to reject adjacent channels. In some embodiments, the overall filter bandwidth of the cascaded LNA stages may be changed by adjusting the position of the center frequencies.

In a non-limiting example in accordance with some embodiments, an example cascade of LNA stages operating around the 2.4 GHz ISM band may have a Q of each stage set to 400 (e.g., an example value selected to ensure robustness) and the center frequencies of the bandpass filters of the LNA stages may be staggered by approximately 8 MHz, resulting in an overall bandwidth around 12 MHz. According to the non-limiting example, the filter may be designed to cover a frequency range from 2.35 GHz to 2.48 GHz. This is merely an example, and other values of Q, center frequencies, and frequency range may be used.

Referring again to FIG. 4A, in some embodiments, certain example circuits for some of the processing and circuit blocks in the example LNA calibration system of FIG. 4A may be used.

Some example LNA stage circuits and related circuits (including buffer circuits) are described briefly as follows in accordance with some embodiments and further details regarding, e.g., these example circuits may be found in, e.g., U.S. Pat. No. 8,941,441, issued Jan. 27, 2015, entitled LNA WITH LINEARIZED GAIN OVER EXTENDED DYNAMIC RANGE, the entirety of which is incorporated herein by reference, and U.S. Pat. No. 9,813,033, issued Nov. 7, 2017, entitled SYSTEM AND METHOD FOR INDUCTOR ISOLATION, the entirety of which is incorporated herein by reference.

It will be understood that these circuits are merely examples in accordance with some LNA architecture, e.g., polar architecture and polar receiver embodiments and that other circuits may be used.

Figure 5:
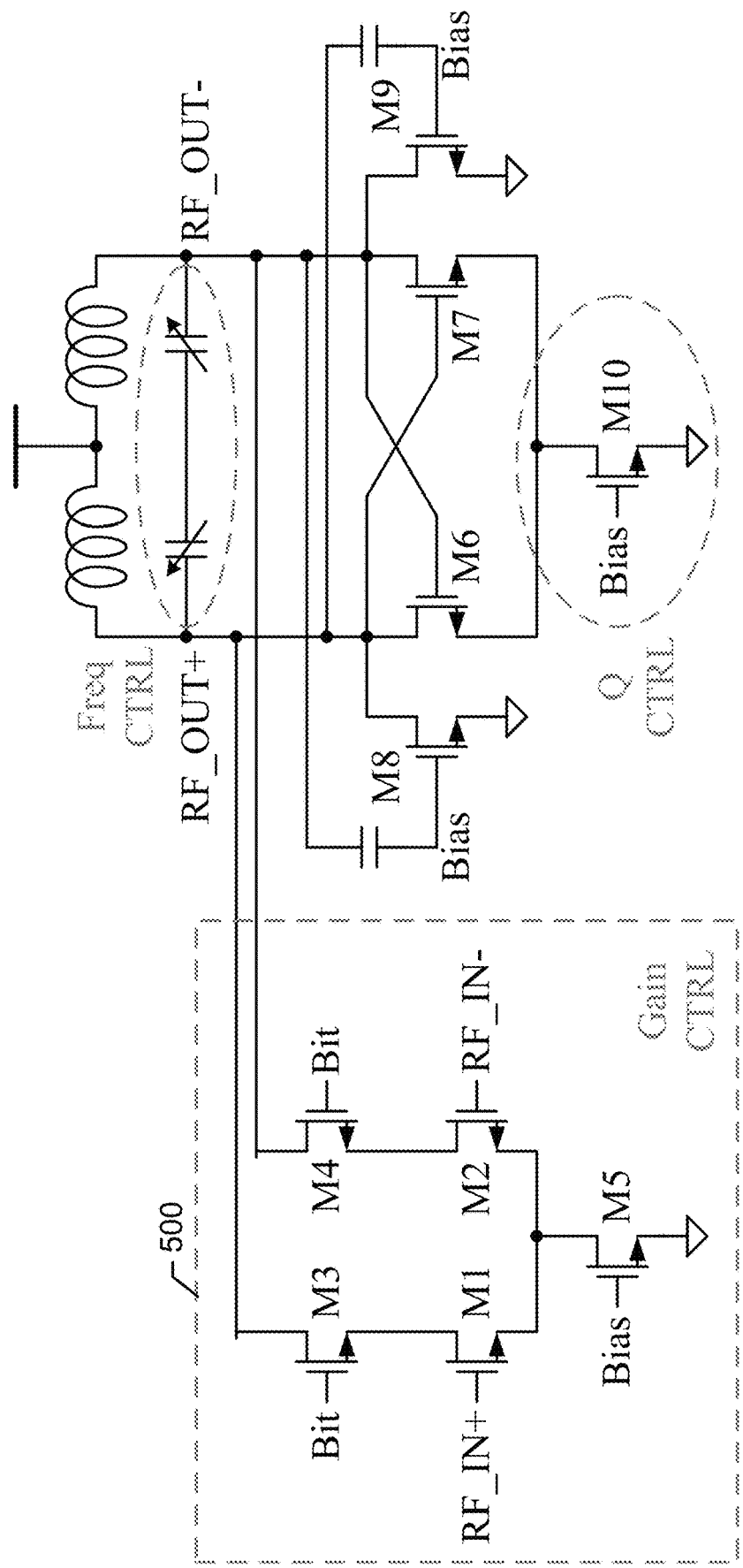
FIG. 5 is a diagram showing an example low-noise amplifier stage circuit in accordance with some embodiments.

Referring again to FIG. 4B, the LNA stages 404, 406, may generally include respective bandpass filters (BPFs) 404b, 406b, e.g., tunable bandpass filters. The LNA stages 404, 406 may include gain stages 404a, 406a, e.g., variable gain stages. FIG. 5 is a diagram showing an example low-noise amplifier stage circuit 500 in accordance with some embodiments. The example LNA stage 500 includes a variable gain stage as well as a tunable bandpass filter load. The example variable gain stage includes the differential MOSFET pair M1, M2, and the control FETs M3, M4, which may be controlled by a "Bit" signal from an LNA controller such as LNA controller circuit 412 (which may provide gain control in some embodiments, as in this example). In some embodiments, the variable gain stage may be configured to provide a variable transconductance gain to drive the bandpass filter load.

Figure 6:
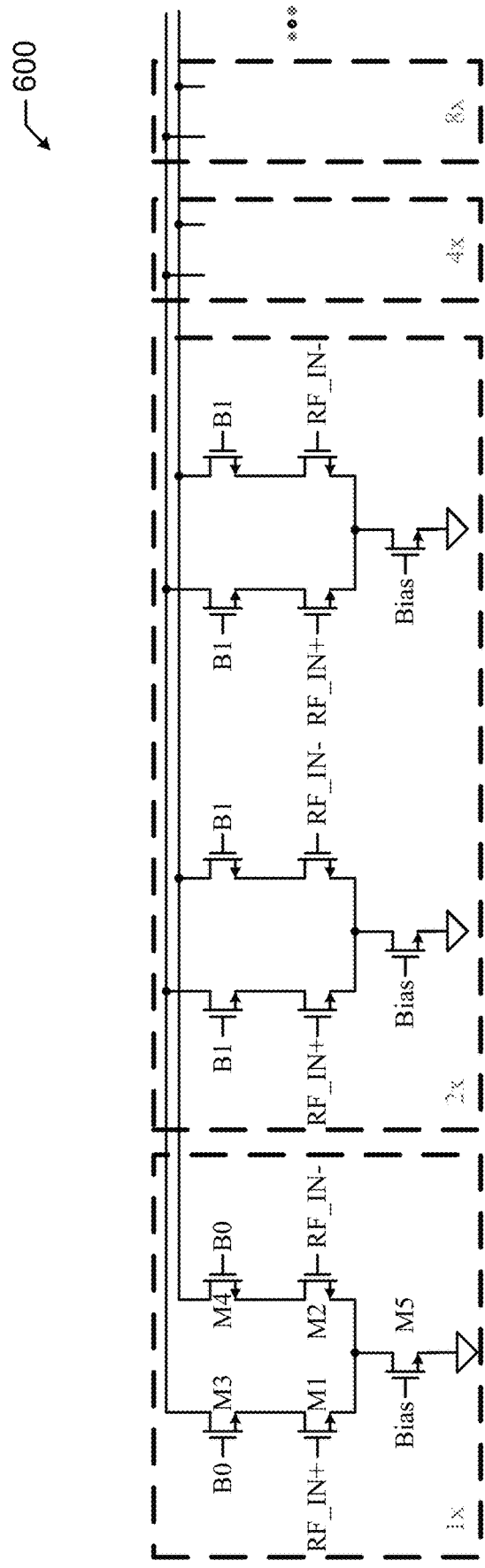
FIG. 6 is a diagram showing an example set of switchable transconductance circuit cells used to provide digitally controlled variable gain in accordance with some embodiments.

FIG. 6 is a diagram showing an example set of switchable transconductance circuit cells 600 used to provide digitally controlled variable gain in accordance with some embodiments. In some embodiments, the LNA stage 500 may include a plurality of switchable transconductance cells 600 connected in parallel such as those shown in FIG. 5. In some embodiments, an LNA controller such as LNA controller circuit 412 may use a binary code to adjust the gain, wherein each gain stage cell provides twice the gain of the prior gain stage cell. In some embodiments, an LNA controller may use a thermometer code control signal to adjust the gain, where each of the gain stage cell may provide equal amounts of gain.

The LNA stage 500 of FIG. 5 includes a tunable bandpass filter acting as the load for the transconductance gain stage. In some embodiments, the tunable bandpass filter may include an adjustable tank circuit with frequency control ("Freq CTRL"). In some embodiments, the adjustable tank circuit may be an LC tank as shown in FIG. 5, or may, for example, be an RC tank circuit. The adjustable capacitors shown in the adjustable tank circuit may, e.g., take the form of a variable capacitor bank.

Figure 7:
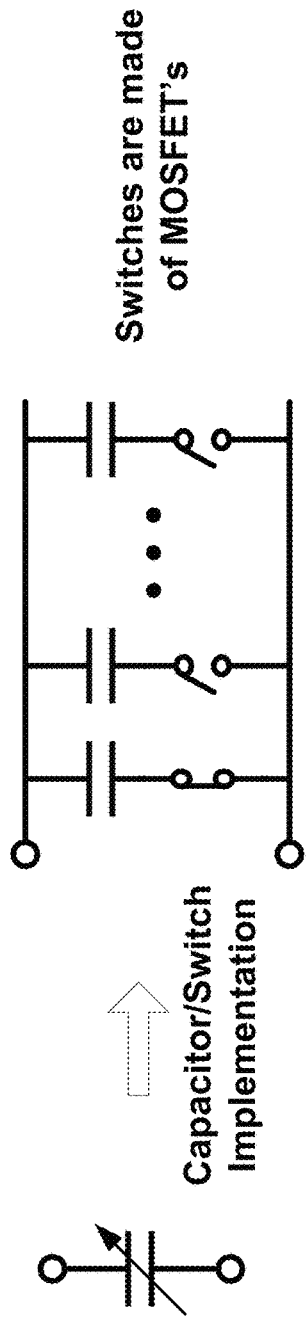
FIGS. 7 and 8 are diagrams showing example variable capacitor bank circuits in accordance with some embodiments.
Figure 8:
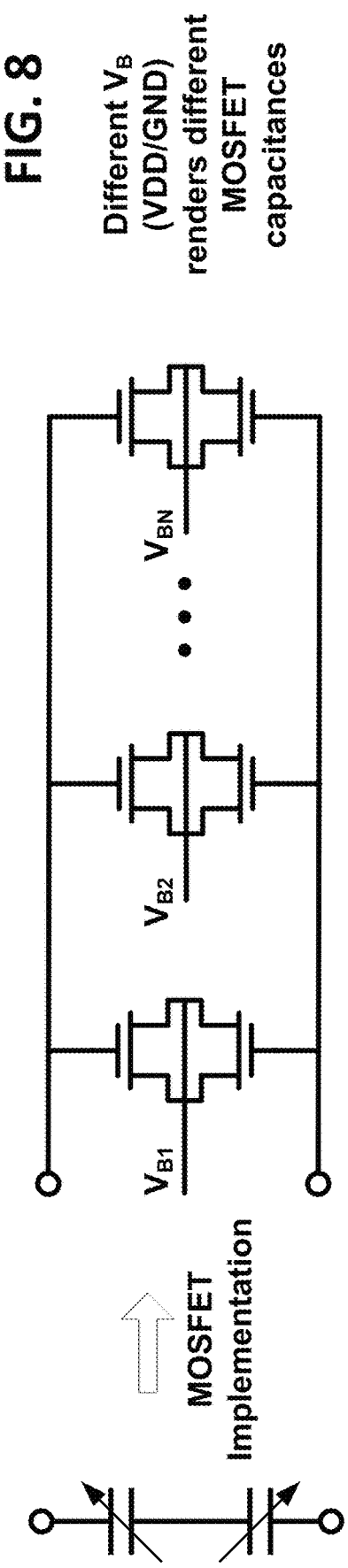

FIGS. 7 and 8 are diagrams showing example variable capacitor bank circuits in accordance with some embodiments. In some embodiments, the LNA stage 500 may include variable capacitor bank circuits such as those shown in FIGS. 7 and 8 to permit adjustment of the resonant frequency or the center frequency of the adjustable tank circuit of the bandpass filter load of the LNA stage. In some embodiments, each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank.

In some embodiments, the example bandpass filter also includes cross-coupled transistors M6, M7 to complete the bandpass load. In some embodiments, the example bandpass filter may also include a cross-coupled compensation transistor pair M8, M9. In some embodiments, these cross-coupled compensation transistors may be biased in a sub-threshold region, to, e.g., extend a linear range of the cross-coupled transistor pair M6, M7 by providing, e.g., a compensation transconductance in the presence of large signals.

As discussed above, in some embodiments, the respective quality factor Q of each of the bandpass filters 404b, 406b of the example LNA stages 404, 406 may be adjusted, e.g., separately. In some embodiments, referring to the example LNA circuit 500 of FIG. 5, as an example of quality factor adjustment, the bias on transistor M10 may be adjusted to change the Q of the bandpass filter load of the LNA circuit 500 by, e.g., changing the value of the tail current of the cross-coupled transistor pair M6, M7. In some embodiments, a very high Q may be used, even as high as 400 or 500. A high Q may, e.g., provide narrow band selection and high rejection of adjacent bands or channels. In some embodiments, the Q may also be reduced by selectively inserting resistances in the tank circuit under the control of an LNA controller, such as the LNA controller circuit 412 of FIG. 4A (via, e.g., control input signal $QF_1$ or $QF_2$). In some embodiments, a Q control signal may include multiple parallel bits for adjusting the Q factor.

Figure 9:
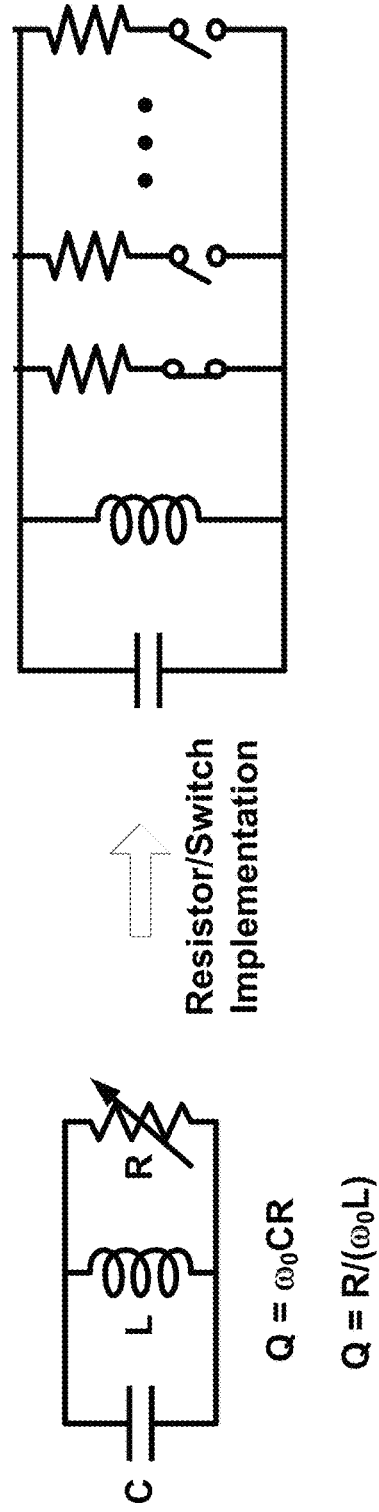
FIG. 9 is a diagram showing an example resistor bank circuit in accordance with some embodiments.

FIG. 9 is a diagram showing an example resistor bank circuit in accordance with some embodiments. In some embodiments, the example LNA stage 500 may include switched resistor bank circuits such as that shown in FIG. 9.

In some embodiments, different gain, bandwidth and out-of-band rejection for the two cascade LNA stages 404, 406 may be achieved by tuning the two LNA stages at different transconductance, frequency (e.g., resonant frequency, center frequency) and Q settings.

Figure 10:
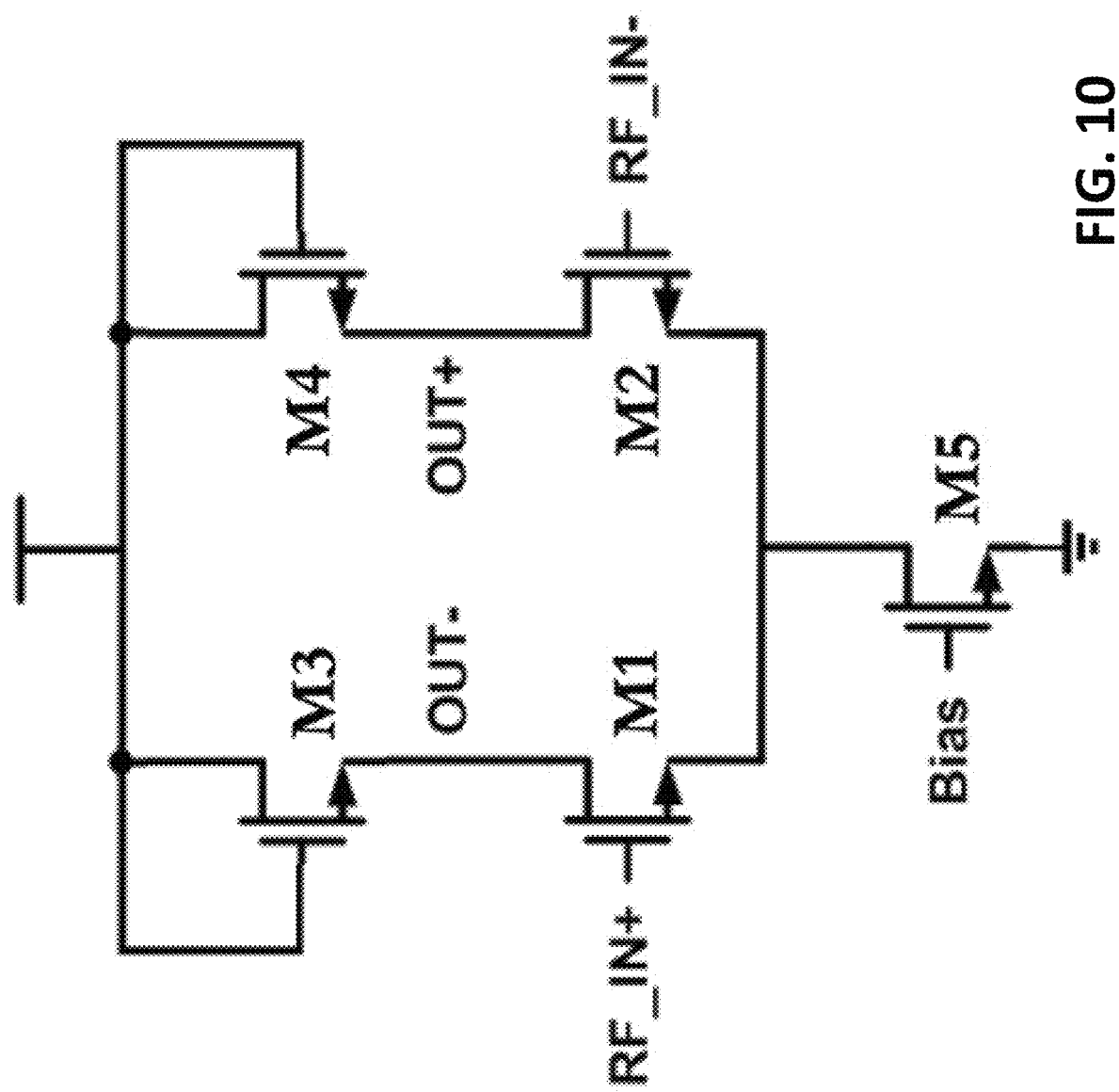
FIG. 10 is a diagram showing an example buffer circuit in accordance with some embodiments.

In some embodiments, and as shown in FIG. 4A, one or more buffers (e.g., buffer 420) may be used through the chain of elements, between LNA stages, following the matching network 418, or between the second LNA stage 406 and the polar receiver stage 408. In some embodiments, Buffers such as buffer 420 may inserted after each LNA stage to improve inter-stage isolation. FIG. 10 is a diagram showing an example buffer circuit in accordance with some embodiments.

In the following figures some example graphs illustrate some example performance characteristics for some example low-noise amplifier and bandpass filter designs (e.g., the example LNA of FIG. 5) and may be referred to for general non-limiting examples of these characteristics, for explanation purposes rather than for particular values or particular ranges of values.

Figure 11:
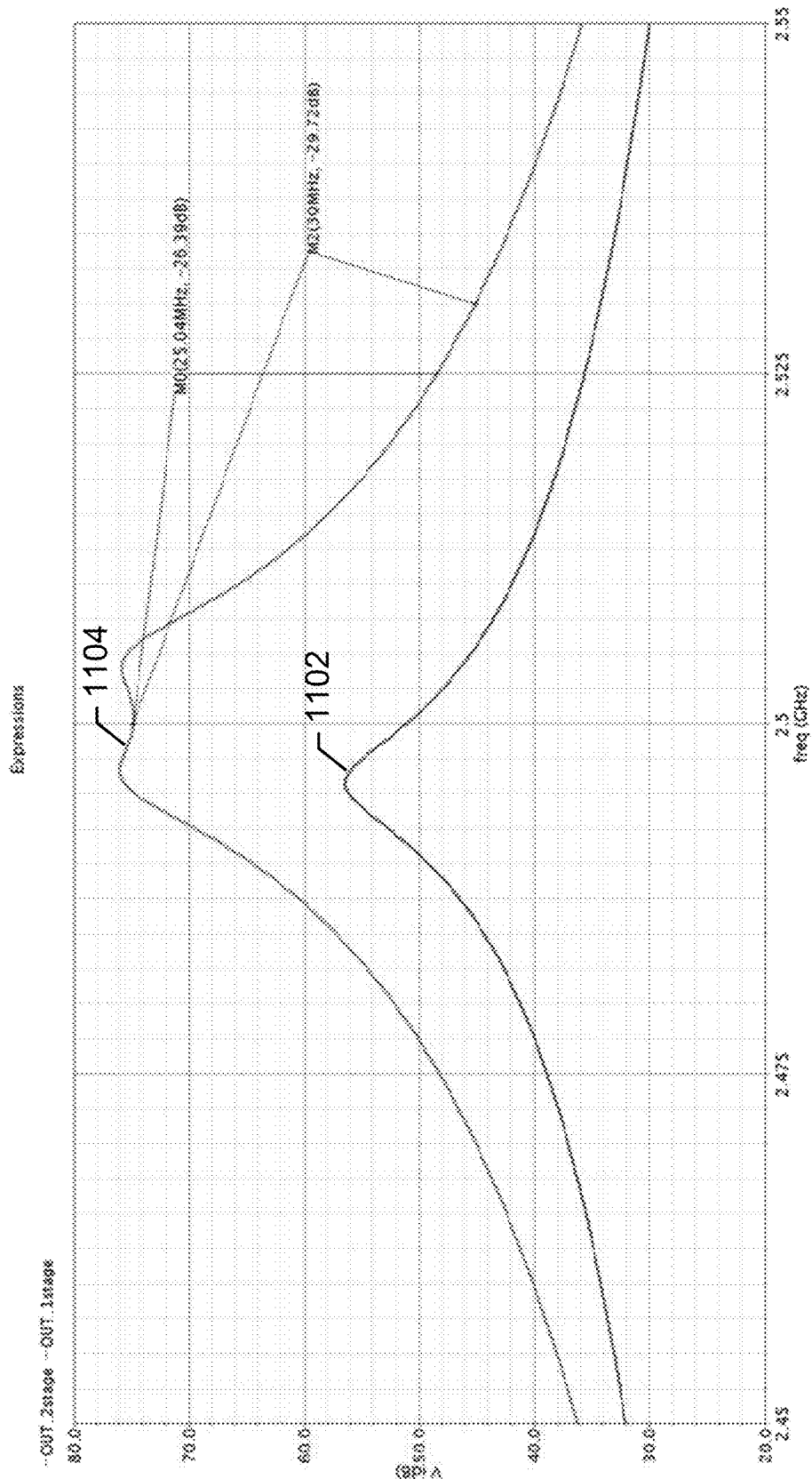
FIG. 11 is a graph of an example frequency response of cascaded low-noise amplifier stages in accordance with some embodiments.

FIG. 11 is a graph of an example frequency response of cascaded low-noise amplifier stages in accordance with some embodiments. The frequency response of an example first LNA stage is showing in plot 1102, while the aggregated response of the example first LNA stage and a second LNA stage is shown in plot 1104.

Figure 12:
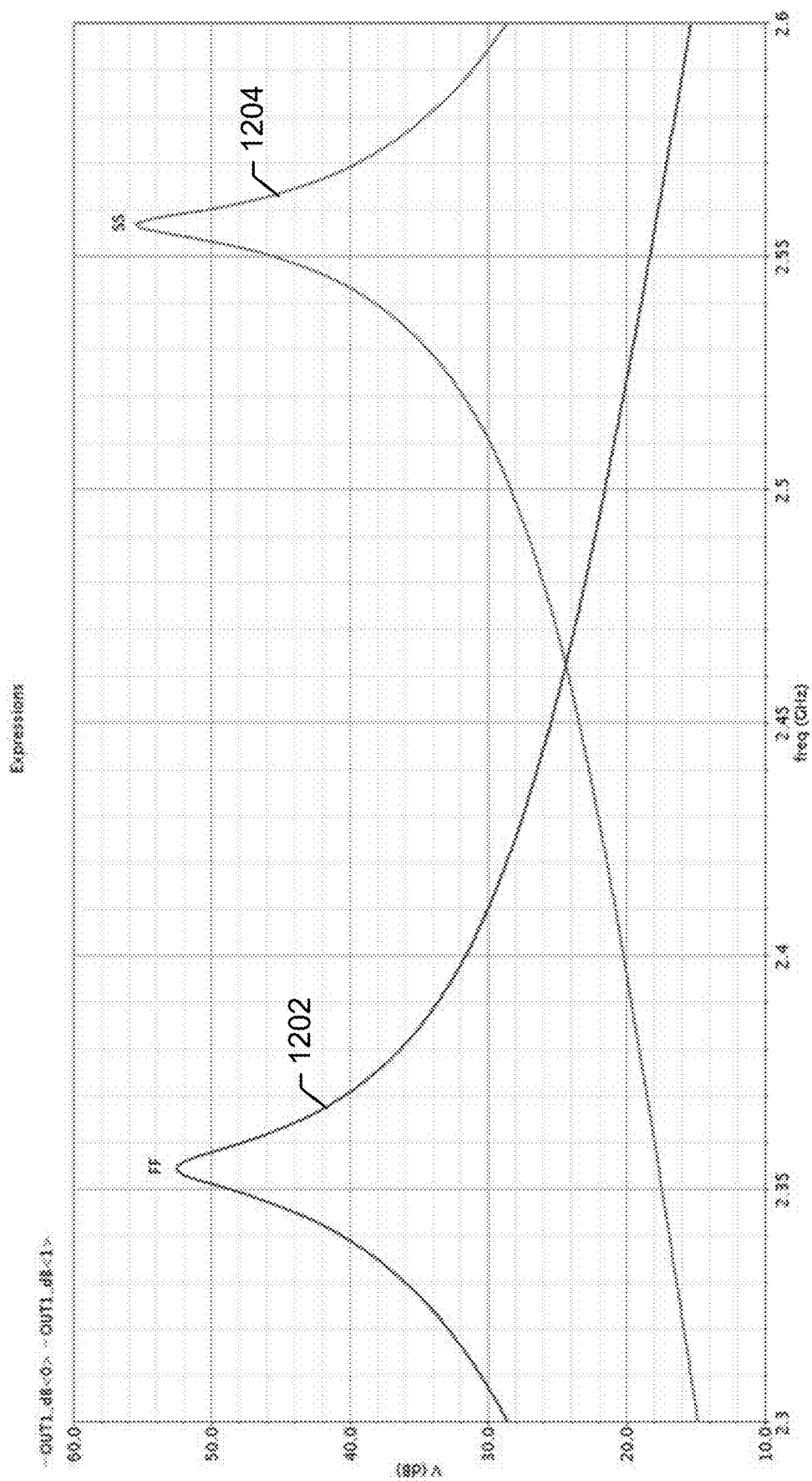
FIG. 12 is a graph of an example tuning of a low-noise amplifier frequency in accordance with some embodiments.

FIG. 12 is a graph of an example tuning of a low-noise amplifier frequency in accordance with some embodiments. A frequency response of an example first LNA stage is shown in both plots 302 and 304, illustrating that the center frequency of the first LNA stage may be tuned (e.g., by tuning the resonant frequency) across a desired frequency band.

Figure 13:
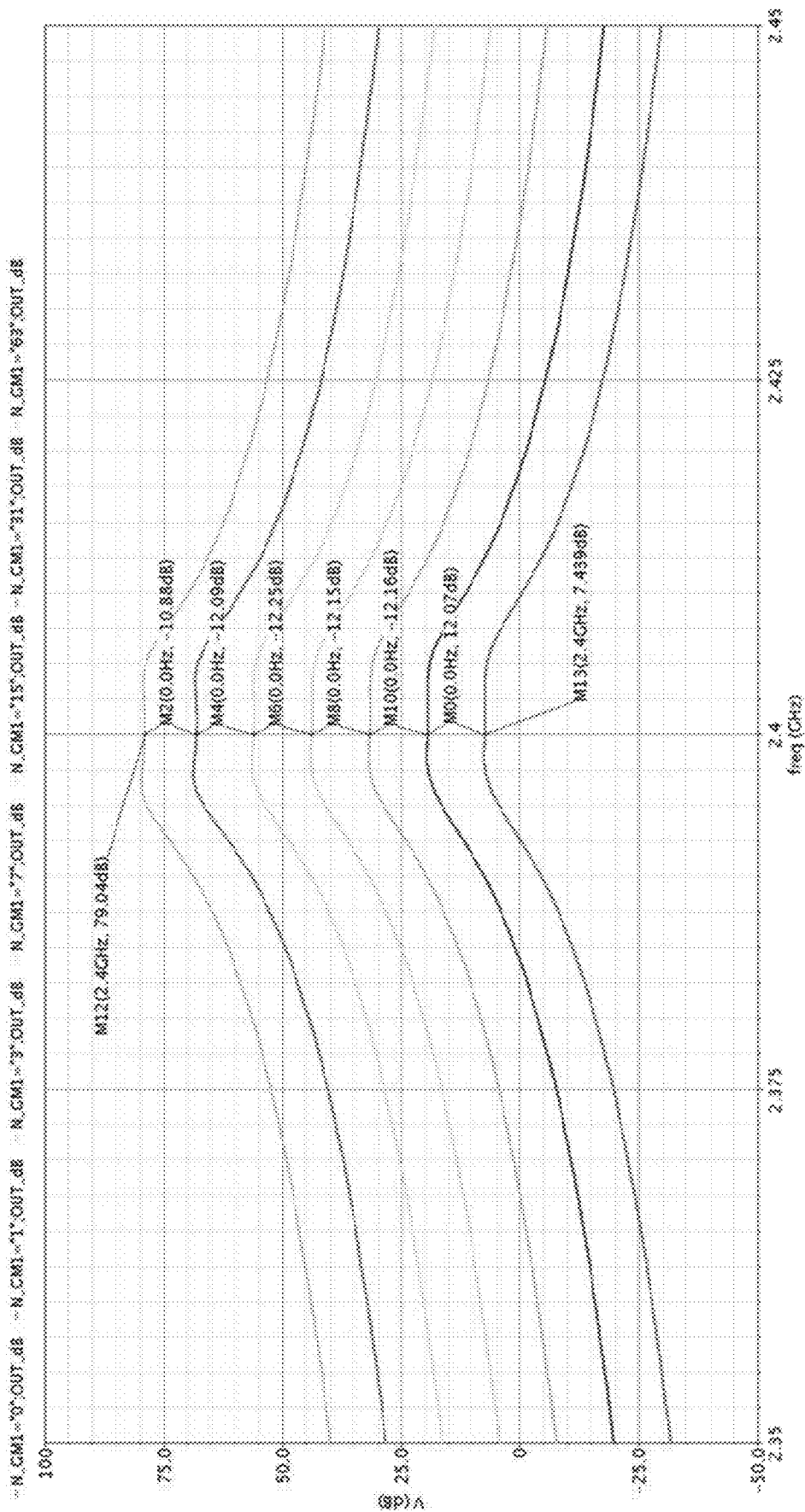
FIG. 13 is a graph of variable gain values of a low-noise amplifier in accordance with some embodiments.

FIG. 13 is a graph of variable gain values of a low-noise amplifier in accordance with some embodiments.

Figure 14:
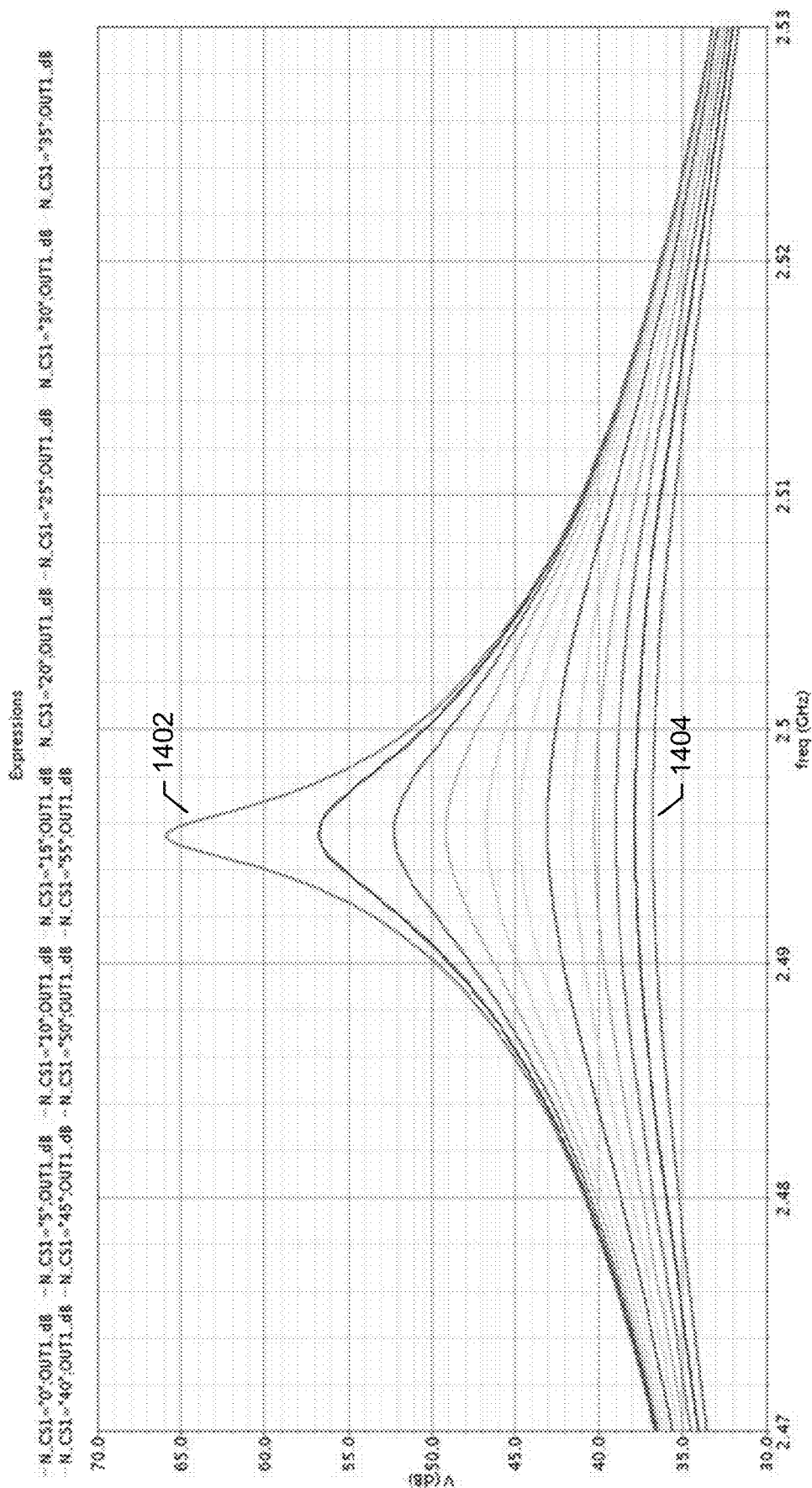
FIG. 14 is a graph showing a range of quality factor values for a low-noise amplifier in accordance with some embodiments.

FIG. 14 is a graph showing a range of quality factor values for a low-noise amplifier in accordance with some embodiments. FIG. 14 shows an adjustment of quality factor Q for an example LNA stage, with plot 1402 showing a high Q, narrow band response, and plot 1404 showing a low Q, very high bandwidth, approaching flatband response.

In some embodiments, a method may include, adjusting a resonant frequency and a Q of a tunable bandpass filter (e.g., a part of an LNA stage). The method may include adjusting the resonant frequency of a tunable bandpass filter by adjusting a capacitor bank. The method may further include adjusting the Q by, e.g., adjusting a bias point of the LNA stage to induce an oscillation in the bandpass filter or resonant tank. The method may further include measuring the resonant frequency of the oscillation and adjusting the resonant frequency of the bandpass filter. A test signal (e.g., a test signal having multiple tones in the same signal, or, e.g., a wideband test signal, etc.) may be used with a frequency response of the tunable bandpass filter to the test signal being estimated by an FFT module such as an FFT signal processor. FFT output values from the FFT module may be used to further calibrate the frequency response of the tunable bandpass filter. A separate tunable bandpass filter (e.g., part of another LNA stage, e.g., cascaded with the tunable bandpass filter) may be brought to flatband (e.g., having a flat frequency response with a low or reduced Q) to focus the FFT module estimation of the frequency response of the tunable bandpass filter to the test signal. In some embodiments, the test signal may be, e.g., transmitted as an OFDM training sequence with no modulated information but having multiple carriers of equal magnitude.

In some embodiments, a method may include, adjusting a first bandpass filter to a first frequency, where the first frequency may be a resonant frequency of a first LNA stage that includes the first bandpass filter. The method may further include, adjusting a second bandpass filter to a second frequency offset from the first frequency, where the second frequency may be a resonant frequency of a second LNA stage that includes the second bandpass filter. According to the example method, the frequency and Q of the first and second LNA stages may then be adjusted. The first frequency and second frequency may be selected in accordance with a desired overall or combined channel bandwidth or desired frequency range. The quality factor Q of the first and second bandpass filters may be adjusted to obtain a desired adjacent channel rejection ratio. Adjusting the first and second bandpass filter resonant frequencies may include, e.g., adjusting a bias point of the respective first or second LNA stage to induce an oscillation in the respective first or second bandpass filter, measuring the resonant frequency of the oscillation, and adjusting the resonant frequency of the respective bandpass filter. A test signal (e.g., a test signal having multiple tones in the same signal, or, e.g., a wideband test signal, etc.) may be used with frequency responses of the first and second bandpass filters to the test signal being separately estimated by an FFT module. During calibration of the respective bandpass filter, FFT output values from the FFT module may be used to further calibrate the frequency response of the respective bandpass filter. During calibration of one of the first and second bandpass filters, the other bandpass filter may be brought to flatband (e.g., having a flat frequency response with a low or reduced Q) to focus the FFT module estimation of the frequency response of the bandpass filter under test to the test signal. In some embodiments, the test signal may be, e.g., transmitted as an OFDM training sequence with no modulated information but having multiple carriers of equal magnitude.

In some embodiments, a method of calibrating a bandpass filter may include estimating, using an FFT module, a frequency response of the bandpass filter to a test signal, e.g., a multi-frequency test signal such as a wideband test signal. The test signal may be centered on a desired center frequency of the bandpass filter. The method may further include comparing FFT output values from an FFT module downstream from the bandpass filter at desired −3 dB point frequencies (lower and upper cutoff frequencies) with one another and shifting a resonant frequency of the bandpass filter responsively to a result of the comparison. The method may further include comparing the FFT output values at the desired −3 dB point frequencies with an FFT values at a desired center frequency and adjusting a quality factor of the bandpass filter responsively to a result of the comparison. In some embodiments, the method may further include measuring a gain of a low-noise amplifier (that includes the bandpass filter) responsively to the quality factor adjustment. In some embodiments, the gain of the bandpass filter may be gradually stepped down to prevent, e.g., saturation of subsequent circuits downstream from the bandpass filter.

In some embodiments, a method of calibrating a bandpass filter may include estimating, using an FFT module, a frequency response of the bandpass filter to a test signal, e.g., a multi-frequency test signal such as a wideband test signal. The test signal may be centered on a desired center frequency of the bandpass filter. The method may further include receiving at least three pairs of output values from an FFT module. The method may further include averaging a first pair of FFT output values to determine a signal magnitude at a desired lower cutoff frequency of the bandpass filter, averaging a second pair of the FFT output values to determine a signal magnitude at a desired upper cutoff frequency of the bandpass filter, and averaging a third pair of the FFT output values to determine a signal magnitude at a desired center frequency of the bandpass filter. The method may further include iteratively comparing the signal magnitudes at the desired lower and upper cutoff frequencies to one another and comparing the signal magnitudes at the desired lower and upper cutoff frequencies to the signal magnitude at the desired center frequency. The method may further include iteratively adjusting the quality factor and the resonant frequency of the bandpass filter based on the comparisons. In some embodiments, the method may further include iteratively adjusting a gain of a low-noise amplifier (that includes the bandpass filter) to prevent, e.g., saturation of subsequent circuits (e.g., an analog-to-digital converter in a receiver stage) downstream from the bandpass filter. The method may further include performing iterative adjustment until a stopping condition is reached.

In some embodiments according to the example method, a stopping condition for iterative adjustment (of, e.g., a calibration algorithm) may include at least one of a determination that the signal magnitudes at the desired lower and upper cutoff frequency being within a defined margin of one another, or a determination that the signal magnitudes at the desired lower and upper cutoff frequency are within a defined margin of being −3 dB down from the signal magnitude at the desired center frequency of the bandpass filter.

In some embodiments, a method of calibrating first and second bandpass filters may include separately estimating, for each bandpass filter, using an FFT module, a frequency response of the respective bandpass filter to a respective test signal, e.g., a multi-frequency test signal such as a wideband test signal. The respective test signal may be centered on a respective desired center frequency of the respective bandpass filter. The method may further include calibrating a receiver stage downstream from the first and second bandpass filters. The calibration of the receiver stage may include ensuring an operating range for the receiver stage centered around a center frequency of a desired overall channel bandwidth of the first and second bandpass filters together. The method may further include determining which bandpass filter of the first and second bandpass filters to test. The method may further include performing a coarse calibration of the bandpass filter under test. In some embodiments, the coarse calibration of the bandpass filter may include inducing an oscillation in the bandpass filter under test, measuring a resonant frequency of the bandpass filter under test, and adjusting the resonant frequency toward a desired center frequency prior to receiving, e.g., the respective test signal for that bandpass filter under test. The method may further include lowering a quality factor of at least one bandpass filter not under test toward a flat frequency response. The method may further include sending the test signal into, e.g., an initial matching circuit such a wideband low-noise amplifier upstream from the bandpass filter under test. The method may further include estimating a frequency response of the bandpass filter under test to the test signal using the FFT module. The method may further include a controller circuit using X of Y (where X≤Y) FFT output values to perform calibration (e.g., fine calibration) of the bandpass filter under test by iteratively adjusting at least a quality factor and the resonant frequency of the bandpass filter under test based on a comparison of the X FFT output values. The method may further include proceeding with the iterative adjustment and updating the estimated frequency response and the FFT output values until a desired center frequency and desired bandwidth of the bandpass filter under test is achieved. The method may further include proceeding to calibrate another bandpass filter, if any.

Although some embodiments are discussed with reference to calibration periods, operating modes, testing modes, and time periods and portions of time periods, this description is used for purposes of providing clarity between a situation in which, e.g., a receiver may be receiving a modulated signal in regular operation, with, e.g., a calibrated receiver (e.g., and amplification stage), versus, when a receiver may be being calibrated in accordance with some sort of testing regimen, but such terminology should not be understood to part of or required by all embodiments. In some embodiments, operating modes and testing modes may overlap, or may not be used at all. In some embodiments, time periods may not be meaningfully used to distinguish between periods of operation and/or of testing, or of, e.g., calibration occurring within, e.g., a particular mode (e.g., a testing mode).

In some embodiments, an apparatus includes a wideband amplifier, at least two low-noise amplifier (LNA) stages, a receiver stage, a Fast Fourier Transform (FFT) signal processor, and a controller circuit.

In some embodiments, the wideband amplifier is configured to, during a testing mode, receive and amplify a wideband test signal. The at least two LNA stages are cascaded together, have an input connected to the wideband amplifier, have an output. The at least two LNA stages together are configured to receive the amplified wideband test signal at the input to generate, within a desired overall bandwidth for the at least two LNA stages, a filtered analog signal at the output. The at least two LNA stages include a first LNA stage and a second LNA stage. The first LNA stage includes a first tunable bandpass filter. The first tunable bandpass filter has a first bandwidth and a first resonant frequency. The second LNA stage includes a second tunable bandpass filter. The second tunable bandpass filter has a second bandwidth and a second resonant frequency.

In some embodiments, the receiver stage is connected to the output of the at least two LNA stages. The receiver stage is configured to receive the filtered analog signal and to generate a digital output sequence.

In some embodiments, the FFT signal processor is configured to, during a first portion of the testing mode, process the digital output sequence to estimate a frequency response of the first LNA stage to the amplified wideband test signal. The estimated frequency response of the first LNA stage includes a first set of FFT output values.

In some embodiments, the controller circuit is in communication with the FFT signal processor, the first LNA stage, and the second LNA stage. The controller circuit is configured to, during the first portion of the testing mode, iteratively calibrate the first bandwidth and the first resonant frequency of the first tunable bandpass filter of the first LNA stage based at least in part on selected FFT output values from the first set of FFT output values of the estimated frequency response of the first LNA stage from the FFT signal processor.

According to the example apparatus, in some embodiments, the controller circuit may be further configured to process the selected FFT output values from the first set of FFT output values to determine signal magnitudes at a desired first center frequency, a desired first lower cutoff frequency, and a desired first upper cutoff frequency of the first tunable bandpass filter of the first LNA stage.

In some embodiments, the controller circuit being further configured to process the selected FFT output values from the first set of FFT output values may include the controller circuit being configured to average pairs of the selected FFT output values from the first set of FFT output values to determine the signal magnitudes at the desired first center frequency, the desired first lower cutoff frequency, and the desired first upper cutoff frequency of the first tunable bandpass filter of the first LNA stage.

In some embodiments, the controller circuit being further configured to process the selected FFT output values from the first set of FFT output values may include the controller circuit being configured to use at least some of the selected FFT output values from the first set of FFT output values as the signal magnitudes at the desired first center frequency, the desired first lower cutoff frequency, and the desired first upper cutoff frequency of the first tunable bandpass filter of the first LNA stage.

In some embodiments, the controller circuit being configured to, during the first portion of the testing mode, iteratively calibrate the first bandwidth and the first resonant frequency of the first tunable bandpass filter of the first LNA stage may include the controller circuit being configured to compare the signal magnitude at the desired first lower cutoff frequency of the first tunable bandpass filter with the signal magnitude at the desired upper cutoff frequency of the first tunable bandpass filter.

In some embodiments, the controller circuit being configured to, during the first portion of the testing mode, iteratively calibrate the first bandwidth and the first resonant frequency of the first tunable bandpass filter of the first LNA stage may include the controller circuit being configured to iteratively adjust the first resonant frequency and a first quality factor the first tunable bandpass filter until (1) the signal magnitudes at the desired first upper cutoff frequency and the desired first lower cutoff frequency of the tunable bandpass filter are substantially equivalent and (2) the signal magnitudes at the desired first upper and first lower cutoff frequencies are substantially −3 dB down from the signal magnitude at the desired center frequency of the first tunable bandpass filter.

According to the example apparatus, in some embodiments, the controller circuit being configured to, during the first portion of the testing mode, iteratively calibrate the first bandwidth and the first resonant frequency of the first tunable bandpass filter of the first LNA stage may include the controller circuit being configured to adjust a first quality factor of the first tunable bandpass filter of the first LNA stage and to adjust the first resonant frequency of the first tunable bandpass filter of the filter LNA stage.

According to the example apparatus, in some embodiments, the FFT signal processor may be further configured to, during a second portion of the testing mode, process the digital output sequence to estimate a frequency response of the second LNA stage to the amplified wideband test signal. The estimated frequency response of the second LNA stage may include a second set of FFT output values.

In some embodiments, the controller circuit may be further configured to, during the second portion of the testing mode, iteratively calibrate the second bandwidth and the second resonant frequency of the second tunable bandpass filter of the second LNA stage based at least in part on selected FFT output values from the second set of FFT output values of the estimated frequency response of the second LNA stage from the FFT signal processor.

According to the example apparatus, in some embodiments, the controller circuit may be further configured to: during the first portion of the testing mode, reduce a first quality factor of the second tunable bandpass filter of the second LNA stage such that the second tunable bandpass filter approaches a flat frequency response; and during a second portion of the testing mode, reduce a second quality factor of the first tunable bandpass filter of the first LNA stage such that the first tunable bandpass filter approaches a flat frequency response.

In some embodiments, the first and second portions of the testing mode may partially overlap with one another in time.

In some embodiments, the second portion of the testing mode may occur before the first portion of the testing mode within one or more testing periods in the testing mode.

According to the example apparatus, in some embodiments, the wideband amplifier may be further configured to, during an operating mode, receive a modulated radio frequency signal with a variable phase component.

According to the example apparatus, in some embodiments, the wideband amplifier may provide impedance matching to a balun and an antenna.

According to the example apparatus, in some embodiments, an input of the second LNA stage may be connected to an output of the wideband amplifier and an output of the second LNA stage may be connected to an input of the first LNA stage.

According to the example apparatus, in some embodiments, an input of the first LNA stage may be connected to an output of the wideband amplifier and an output of the first LNA stage may be connected to the input of the second LNA stage.

In some embodiments, the example apparatus may further include at least one of: a first buffer connecting the output of the first LNA stage to the input of the second LNA stage; or a second buffer connecting the output of the at least two LNA stages to the receiver stage.

According to the example apparatus, in some embodiments, the digital output sequence may include in-phase (I) and quadrature (Q) baseband signals.

According to the example apparatus, in some embodiments, the receiver stage may include a polar receiver and a CORDIC signal generator. The polar receiver may be configured to output amplitude and phase digital sample values. The CORDIC signal generator may be configured to receive the amplitude and phase digital sample values from the polar receiver and to perform polar to rectangular coordinate conversion to generate the digital output sequence as in-phase (I) and quadrature (Q) rectangular coordinate digital sample values.

According to the example apparatus, in some embodiments, the apparatus (for example, the controller circuit) may be further configured to calibrate the receiver stage toward a desired center frequency of the desired overall bandwidth of the at least two LNA stages.

According to the example apparatus, in some embodiments, the apparatus may further include a test signal generator in communication with the controller circuit. The test signal generator may be configured to, during the testing mode, generate the wideband test signal.

In some embodiments, the test signal generator may include a transmitter. The transmitter may be configured to, during the testing mode, generate the wideband test signal. The transmitter may be further configured to, during an operating mode, transmit at least one of a phase modulated or a frequency modulated radio frequency signal.

According to the example apparatus, in some embodiments, the wideband test signal is an Orthogonal Frequency Division Multiplexing (OFDM) training sequence having equivalent signal components spaced at multiple distinct frequencies over a wider spectrum than the desired overall bandwidth of the at least two LNA stages.

According to the example apparatus, in some embodiments, the apparatus may further include a transmitter. The transmitter may be configured to, during the testing mode, transmit the wideband test signal. The transmitter being configured to, during the testing mode, transmit the wideband test signal may include the transmitter being configured to, during the first portion of the testing mode, transmit the wideband test signal centered at a desired first center frequency of the first tunable bandpass filter of the first LNA stage. The transmitter being configured to, during the testing mode, transmit the wideband test signal may further include the transmitter being configured to, during a second portion of the testing mode, transmit the wideband test signal centered at a desired second center frequency of the second tunable bandpass filter of the second LNA stage.

In some embodiments, the wideband test signal centered at the desired first center frequency is an identical signal to the wideband test signal centered at the desired second center frequency except for the centering of the wideband test signal.

In some embodiments, the first LNA stage further includes a variable gain amplifier stage coupled to the first tunable bandpass filter of the first LNA stage.

Figure 15:
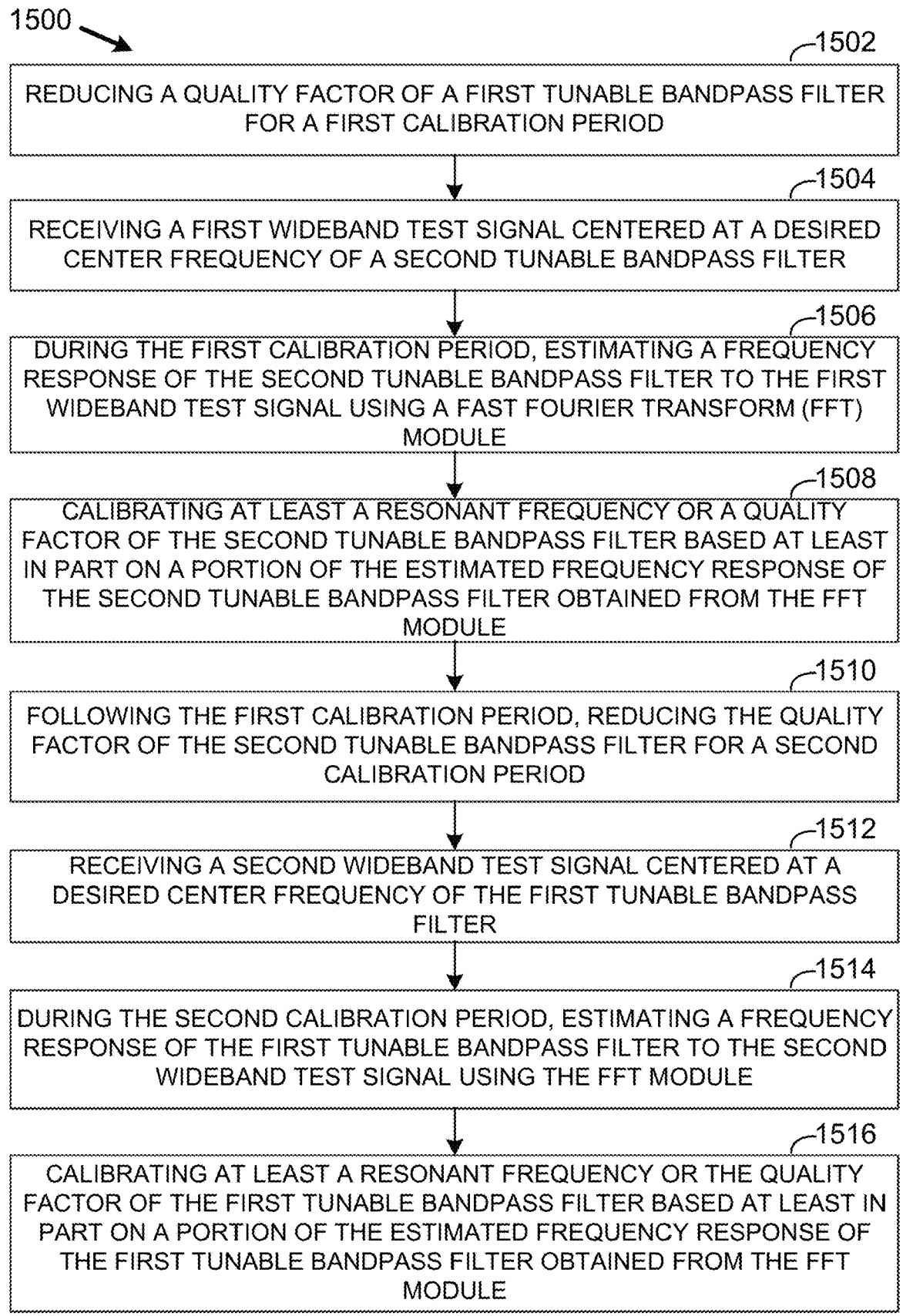
FIG. 15 is a flow diagram illustrating an example method in accordance with some embodiments.

FIG. 15 is a flow diagram illustrating an example method 1500 in accordance with some embodiments. The method includes, at 1502, reducing a quality factor of a first tunable bandpass filter for a first calibration period. The method further includes, at 1504, receiving a first wideband test signal centered at a desired center frequency of a second tunable bandpass filter. The method further includes, at 1506, during the first calibration period, estimating a frequency response of the second tunable bandpass filter to the first wideband test signal using a Fast Fourier Transform (FFT) signal processor. The method further includes, at 1508, calibrating at least a resonant frequency or a quality factor of the second tunable bandpass filter based at least in part on a portion of the estimated frequency response of the second tunable bandpass filter obtained from the FFT signal processor. The method further includes, at 1510, following the first calibration period, reducing the quality factor of the second tunable bandpass filter for a second calibration period. The method further includes, at 1512, receiving a second wideband test signal centered at a desired center frequency of the first tunable bandpass filter. The method further includes, at 1514, during the second calibration period, estimating a frequency response of the first tunable bandpass filter to the second wideband test signal using the FFT signal processor. The method further includes, at 1516, calibrating at least a resonant frequency or the quality factor of the first tunable bandpass filter based at least in part on a portion of the estimated frequency response of the first tunable bandpass filter obtained from the FFT signal processor.

In some embodiments, according to the example method 1500, a first low-noise amplifier (LNA) stage includes the first tunable bandpass filter and a second LNA stage includes the second tunable bandpass filter.

In some embodiments, an output of the first LNA stage is connected to an input of the second LNA stage.

In some embodiments, an output of the second LNA stage is connected to an input of the first LNA stage.

In some embodiments, according to the example method 1500, the first and second wideband test signals are identical apart from being centered at different desired center frequencies, and the desired center frequency of the first tunable bandpass filter is different from the desired center frequency of the second tunable bandpass filter.

In some embodiments, according to the example method 1500, at least the first wideband test signal is an Orthogonal Frequency Division Multiplexing (OFDM) training sequence.

In some embodiments, according to the example method 1500, at least the first wideband test signal includes a multi-tone signal having signal components at multiple distinct tones within the same signal.

In some embodiments, according to the example method 1500, the method may further include, prior to determining the estimated frequency response of the second tunable bandpass filter, calibrating a receiver stage, wherein an input of the receiver stage is connected to an output of the second tunable bandpass filter and an output of the receiver stage is connected to an input of the FFT signal processor.

In some embodiments, according to the example method 1500, the method may further include, prior to determining the estimated frequency response of the second tunable bandpass filter, performing a coarse calibration of the second tunable bandpass filter.

In some embodiments, performing the coarse calibration of the second tunable bandpass filter may include: inducing an oscillation in the second tunable bandpass filter; measuring the resonant frequency of the second tunable bandpass filter; and adjusting the resonant frequency of the second tunable bandpass filter toward a desired center frequency prior to receiving the first wideband test signal centered at the desired center frequency of the second tunable bandpass filter.

Figure 16:
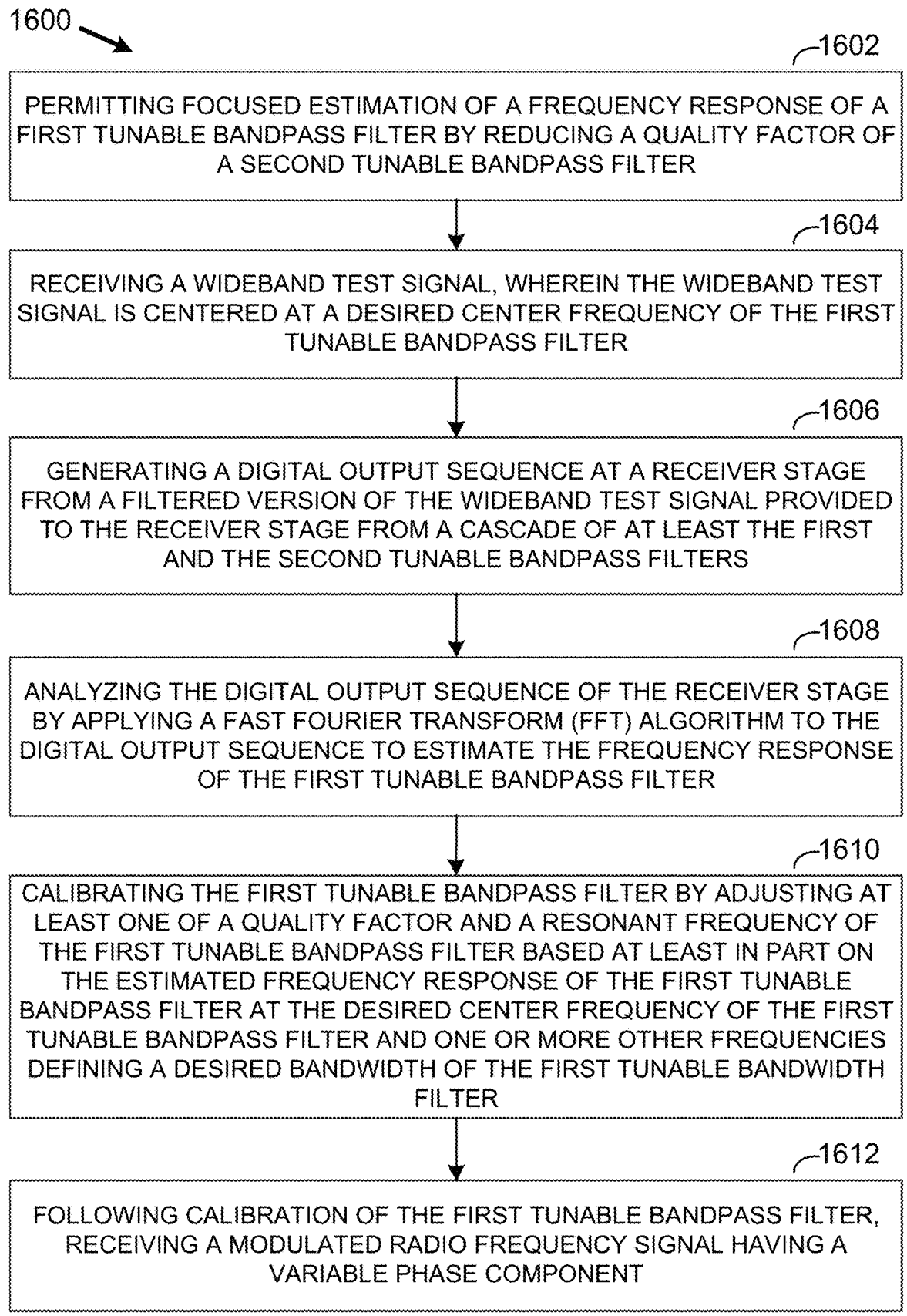
FIG. 16 is a flow diagram illustrating another example method in accordance with some embodiments.

FIG. 16 is a flow diagram illustrating another example method 1600 in accordance with some embodiments. The method includes, at 1602, permitting focused estimation of a frequency response of a first tunable bandpass filter by reducing a quality factor of a second tunable bandpass filter. The method further includes, at 1604, receiving a wideband test signal, wherein the wideband test signal is centered at a desired center frequency of the first tunable bandpass filter. The method further includes, at 1606, generating a digital output sequence at a receiver stage from a filtered version of the wideband test signal provided to the receiver stage from a cascade of at the first and the second tunable bandpass filters. The method further includes, at 1608, analyzing the digital output sequence of the receiver stage by applying a Fast Fourier Transform (FFT) algorithm to the digital output sequence to estimate the frequency response of the first tunable bandpass filter. The method further includes, at 1610, calibrating the first tunable bandpass filter by adjusting at least one of a quality factor and a resonant frequency of the first tunable bandpass filter based at least in part on the estimated frequency response of the first tunable bandpass filter at the desired center frequency of the first tunable bandpass filter and one or more other frequencies defining a desired bandwidth of the first tunable bandpass filter. The method further includes, at 1612, following calibration of the first tunable bandpass filter, receiving a modulated radio frequency signal having a variable phase component.

In some embodiments, according to the example method 1600, a first low-noise amplifier (LNA) stage includes the first tunable bandpass filter and a second LNA stage includes the second tunable bandpass filter.

In some embodiments, calibrating the first tunable bandpass filter may include adjusting a gain of the first LNA stage.

In some embodiments, according to the example method 1600, the one or more frequencies defining a desired bandwidth of the first tunable bandpass filter include a desired lower cutoff frequency and a desired upper cutoff frequency of the first tunable bandpass filter.

In some embodiments, according to the example method 1600, the method may further include, prior to receiving the modulated radio frequency signal having the variable phase component: permitting focused estimation of a frequency response of the second tunable bandpass filter by reducing the quality factor of the first tunable bandpass filter; receiving a second wideband test signal, wherein the second wideband test signal is centered at a desired center frequency of the second tunable bandpass filter; generating a second digital bit sequence at the receiver stage from a filtered version of the second wideband test signal provided to the receiver stage from the cascade of at least the first and second tunable bandpass filters; analyzing the second digital bit sequence of the receiver stage by applying the FFT algorithm to the digital bit sequence to estimate the frequency response of the second tunable bandpass filter; and calibrating the second tunable bandpass filter based at least in part on the estimated frequency response of the second tunable bandpass filter at the desired center frequency of the second tunable bandpass filter and one or more other frequencies defining a desired bandwidth of the second tunable bandpass filter.

In some embodiments, according to the example method 1600, the method may further include further permitting focused estimation of the frequency response of the first tunable bandpass filter by calibrating the receiver stage prior to determining the estimated frequency response of the first tunable bandpass filter.

Figure 17:
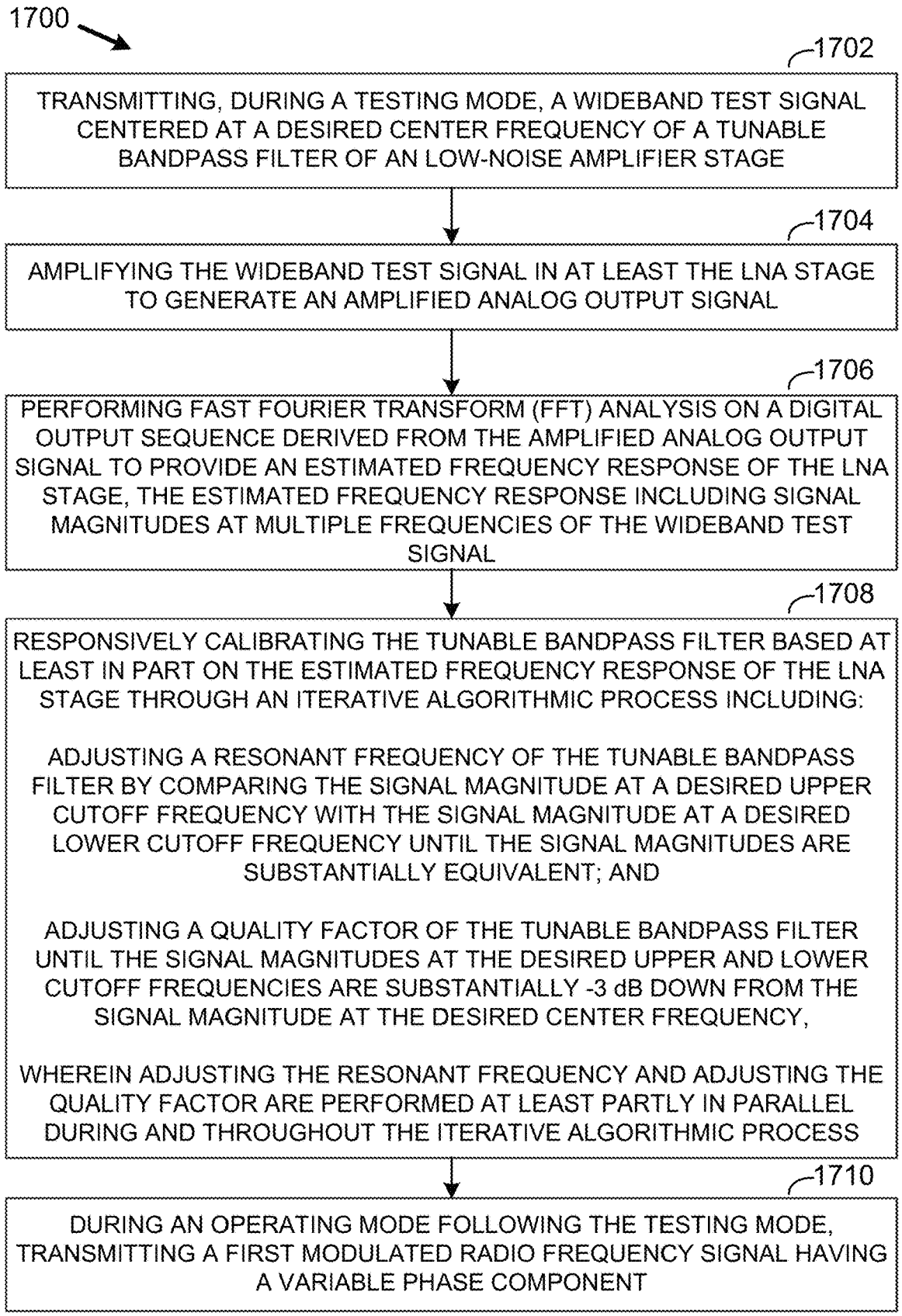
FIG. 17 is a flow diagram illustrating another example method in accordance with some embodiments.

FIG. 17 is a flow diagram illustrating another example method 1700 in accordance with some embodiments. In some embodiments, the method may be implemented by a polar transceiver. The method includes, at 1702, transmitting, during a testing mode, a wideband test signal centered at a desired center frequency of a tunable bandpass filter of a low-noise amplifier (LNA) stage. The method further includes, at 1704, amplifying the wideband test signal in at least the LNA stage to generate an amplified analog output signal. The method further includes, at 1706, performing Fast Fourier Transform (FFT) analysis on a digital output sequence derived from the amplified analog output signal to provide an estimated frequency response of the LNA stage, the estimated frequency response including signal magnitudes at multiple frequencies of the wideband test signal. The method further includes, at 1708, responsively calibrating the tunable bandpass filter based at least in part on the estimated frequency response of the LNA stage through an iterative algorithmic process. The iterative algorithmic process may include: adjusting a resonant frequency of the tunable bandpass filter by comparing the signal magnitude at a desired upper cutoff frequency with the signal magnitude at a desired lower cutoff frequency until the signal magnitudes are substantially equivalent; and adjusting a quality factor of the tunable bandpass filter until the signal magnitudes at the desired upper and lower cutoff frequencies are substantially −3 dB down from the signal magnitude at the desired center frequency. Adjusting the resonant frequency and adjusting the quality factor may be performed at least partly in parallel during and throughout the iterative algorithmic process. The method further includes, at 1710, during an operating mode following the testing mode, transmitting a first modulated radio frequency signal having a variable phase component.

In some embodiments, according to the example method 1700, the method may further include, during the operating mode, receiving a second modulated radio frequency signal having a variable phase component.

In some embodiments, according to the example method 1700, responsively calibrating the tunable bandpass filter based at least in part on the estimated frequency response through the iterative algorithmic process may further include: adjusting a gain of the LNA stage, wherein adjusting the gain, adjusting the resonant frequency, and adjusting the quality factor are all performed at least partly in parallel during and throughout the iterative algorithmic process.

In some embodiments, according to the example method 1700, responsively calibrating the tunable bandpass filter based at least in part on the estimated frequency response through the iterative algorithmic process may further include: obtaining at least some signal magnitudes from the estimated frequency response of the LNA stage; and determining the signal magnitude at the desired upper cutoff frequency, the signal magnitude at the desired lower cutoff frequency, and the signal magnitude at the desired center frequency by averaging pairs of signal magnitudes from the at least some signal magnitudes obtained from the estimated frequency response of the LNA stage.

FIG. 18 is a flow diagram illustrating another example method 1800 in accordance with some embodiments. The method includes, at 1802, filtering, using a tunable bandpass filter, a wideband test signal, wherein the wideband test signal is centered at a desired center frequency of the tunable bandpass filter. The method further includes, at 1804, applying a Fast Fourier Transform (FFT) algorithm to the filtered version of the wideband test signal to estimate the frequency response of the tunable bandpass filter. The method further includes, at 1806, calibrating the tunable bandpass filter by adjusting at least one of a quality factor and a resonant frequency of the tunable bandpass filter based at least in part on the estimated frequency response of the tunable bandpass filter at the desired center frequency of the tunable bandpass filter and one or more other frequencies defining a desired bandwidth of the tunable bandpass filter.

In some embodiments, according to the example method 1800, the tunable bandpass filter may be located on a receive path, and the method may further include, following calibration of at least the tunable bandpass filter, receiving a modulated radio frequency signal having a variable phase component.

In some embodiments, according to the example method 1800, the tunable bandpass filter may be located on a transmit path, and the method may further include, following calibration of at least the tunable bandpass filter, transmitting a modulated radio frequency signal having a variable phase component.

In some embodiments, the example method may further include, transmitting the filtered version of the wideband test signal. The example method may further include receiving the transmitted filtered version of the wideband test signal at an antenna; and generating a digital output sequence at a receiver stage from the received transmitted filtered version of the wideband test signal. In some embodiments, applying the FFT algorithm to the filtered version of the wideband test signal to estimate the frequency response of the tunable bandpass filter may include analyzing the digital output sequence of the receiver stage by applying the FFT algorithm to the digital output sequence.

In some embodiments, according to the example method 1800, the method may further include permitting focused estimation of the frequency response of the tunable bandpass filter by reducing a quality factor of a second tunable bandpass filter.

In some embodiments, the example method may further include permitting focused estimation of a frequency response of the second tunable bandpass filter by reducing the quality factor of the first tunable bandpass filter; filtering, using the second tunable bandpass filter, a second wideband test signal, wherein the second wideband test signal is centered at a desired center frequency of the second tunable bandpass filter; applying the FFT algorithm to the filtered version of the second wideband test signal to estimate the frequency response of the second tunable bandpass filter; and calibrating the second tunable bandpass filter based at least in part on the estimated frequency response of the second tunable bandpass filter at the desired center frequency of the second tunable bandpass filter and one or more other frequencies defining a desired bandwidth of the second tunable bandpass filter.

EXAMPLE EMBODIMENTS

The following are example embodiments, not claims.

A1. A method, comprising:
reducing a quality factor of a first tunable bandpass filter for a first calibration period;
receiving a first wideband test signal centered at a desired center frequency of a second tunable bandpass filter;
during the first calibration period, estimating a frequency response of the second tunable bandpass filter to the first wideband test signal using a Fast Fourier Transform (FFT) signal processor;
calibrating at least a resonant frequency or a quality factor of the second tunable bandpass filter based at least in part on a portion of the estimated frequency response of the second tunable bandpass filter obtained from the FFT signal processor;
following the first calibration period, reducing the quality factor of the second tunable bandpass filter for a second calibration period;
receiving a second wideband test signal centered at a desired center frequency of the first tunable bandpass filter;
during the second calibration period, estimating a frequency response of the first tunable bandpass filter to the second wideband test signal using the FFT signal processor; and
calibrating at least a resonant frequency or the quality factor of the first tunable bandpass filter based at least in part on a portion of the estimated frequency response of the first tunable bandpass filter obtained from the FFT signal processor.

A2. The method of claim A1, wherein a first low-noise amplifier (LNA) stage comprises the first tunable bandpass filter and a second LNA stage comprises the second tunable bandpass filter.

A3. The method of claim A2, wherein an output of the first LNA stage is connected to an input of the second LNA stage.

A4. The method of claim A2, wherein an output of the second LNA stage is connected to an input of the first LNA stage.

A5. The method of claim A1, wherein the first and second wideband test signals are identical apart from being centered at different desired center frequencies, the desired center frequency of the first tunable bandpass filter being different from the desired center frequency of the second tunable bandpass filter.

A6. The method of claim A1, wherein at least the first wideband test signal is an Orthogonal Frequency Division Multiplexing (OFDM) training sequence.

A7. The method of claim A1, wherein at least the first wideband test signal comprises a multi-tone signal having signal components at multiple distinct tones within the same signal.

A8. The method of claim A1, further comprising:
prior to determining the estimated frequency response of the first tunable bandpass filter, calibrating a receiver stage, wherein an input of the receiver stage is connected to an output of the second tunable bandpass filter and an output of the receiver stage is connected to an input of the FFT signal processor.

A9. The method of claim A1, further comprising:
prior to determining the estimated frequency response of the second tunable bandpass filter, performing a coarse calibration of the second tunable bandpass filter.

A10. The method of claim A9, wherein performing the coarse calibration of the second tunable bandpass filter comprises:
inducing an oscillation in the second tunable bandpass filter;
measuring the resonant frequency of the second tunable bandpass filter; and
adjusting the resonant frequency of the second tunable bandpass filter toward a desired center frequency prior to receiving the first wideband test signal centered at the desired center frequency of the second tunable bandpass filter.

B1. A method, comprising:
permitting focused estimation of a frequency response of a first tunable bandpass filter by reducing a quality factor of a second tunable bandpass filter;
receiving a wideband test signal, wherein the wideband test signal is centered at a desired center frequency of the first tunable bandpass filter;
generating a digital output sequence at a receiver stage from a filtered version of the wideband test signal provided to the receiver stage from a cascade of at the first and the second tunable bandpass filters;
analyzing the digital output sequence of the receiver stage by applying a Fast Fourier Transform (FFT) algorithm to the digital output sequence to estimate the frequency response of the first tunable bandpass filter;
calibrating the first tunable bandpass filter by adjusting at least one of a quality factor and a resonant frequency of the first tunable bandpass filter based at least in part on the estimated frequency response of the first tunable bandpass filter at the desired center frequency of the first tunable bandpass filter and one or more other frequencies defining a desired bandwidth of the first tunable bandpass filter; and
following calibration of the first tunable bandpass filter, receiving a modulated radio frequency signal having a variable phase component.

B2. The method of claim B1, wherein a first low-noise amplifier (LNA) stage comprises the first tunable bandpass filter and a second LNA stage comprises the second tunable bandpass filter.

B3. The method of claim B2, wherein calibrating the first tunable bandpass filter comprises:
adjusting a gain of the first LNA stage.

B4. The method of claim B1, wherein the one or more frequencies defining a desired bandwidth of the first tunable bandpass filter comprise a desired lower cutoff frequency and a desired upper frequency of the first tunable bandpass filter.

B5. The method of claim B1, further comprising:
prior to receiving the modulated radio frequency signal having the variable phase component:
permitting focused estimation of a frequency response of the second tunable bandpass filter by reducing the quality factor of the first tunable bandpass filter;
receiving a second wideband test signal, wherein the second wideband test signal is centered at a desired center frequency of the second tunable bandpass filter;
generating a second digital bit sequence at the receiver stage from a filtered version of the second wideband test signal provided to the receiver stage from the cascade of at least the first and second tunable bandpass filters;
analyzing the second digital bit sequence of the receiver stage by applying the FFT algorithm to the digital bit sequence to estimate the frequency response of the second tunable bandpass filter; and
calibrating the second tunable bandpass filter based at least in part on the estimated frequency response of the second tunable bandpass filter at the desired center frequency of the second tunable bandpass filter and one or more other frequencies defining a desired bandwidth of the second tunable bandpass filter.

B6. The method of claim B1, further comprising:
further permitting focused estimation of the frequency response of the first tunable bandpass filter by calibrating the receiver stage prior to determining the estimated frequency response of the first tunable bandpass filter.

C1. A method implemented by a polar transceiver, comprising:
transmitting, during a testing mode, a wideband test signal centered at a desired center frequency of a tunable bandpass filter of a low-noise amplifier (LNA) stage;
amplifying the wideband test signal in at least the LNA stage to generate an amplified analog output signal;
performing Fast Fourier Transform (FFT) analysis on a digital output sequence derived from the amplified analog output signal to provide an estimated frequency response of the LNA stage, the estimated frequency response including signal magnitudes at multiple frequencies of the wideband test signal;
responsively calibrating the tunable bandpass filter based at least in part on the estimated frequency response of the LNA stage through an iterative algorithmic process comprising:
adjusting a resonant frequency of the tunable bandpass filter by comparing the signal magnitude at a desired upper cutoff frequency with the signal magnitude at a desired lower cutoff frequency until the signal magnitudes are substantially equivalent; and
adjusting a quality factor of the tunable bandpass filter until the signal magnitudes at the desired upper and lower cutoff frequencies are substantially −3 dB down from the signal magnitude at the desired center frequency,
wherein adjusting the resonant frequency and adjusting the quality factor are performed at least partly in parallel during and throughout the iterative algorithmic process; and
during an operating mode following the testing mode, transmitting a first modulated radio frequency signal having a variable phase component.

C2. The method of claim C1, further comprising:
during the operating mode, receiving a second modulated radio frequency signal having a variable phase component.

C3. The method of claim C1, wherein responsively calibrating the tunable bandpass filter based at least in part on the estimated frequency response through the iterative algorithmic process further comprises:
adjusting a gain of the LNA stage, wherein adjusting the gain, adjusting the resonant frequency, and adjusting the quality factor are all performed at least partly in parallel during and throughout the iterative algorithmic process.

C4. The method of claim C1, wherein responsively calibrating the tunable bandpass filter based at least in part on the estimated frequency response through the iterative algorithmic process further comprises:
obtaining at least some signal magnitudes from the estimated frequency response of the LNA stage; and
determining the signal magnitude at the desired upper cutoff frequency, the signal magnitude at the desired lower cutoff frequency, and the signal magnitude at the desired center frequency by averaging pairs of signal magnitudes from the at least some signal magnitudes obtained from the estimated frequency response of the LNA stage.

D1. An apparatus comprising:
a wideband amplifier configured to, during a testing mode, receive and amplify a wideband test signal;
at least two low-noise amplifier (LNA) stages being cascaded together and having an input connected to the wideband amplifier and having an output, the at least two LNA stages together being configured to receive the amplified wideband test signal at the input to generate, within a desired overall bandwidth for the at least two LNA stages, a filtered analog signal at the output, the at least two LNA stages comprising a first LNA stage and a second LNA stage, the first LNA stage comprising a first tunable bandpass filter, the first tunable bandpass filter having a first bandwidth and a first resonant frequency, and the second LNA stage comprising a second tunable bandpass filter, the second tunable bandpass filter having a second bandwidth and a second resonant frequency;
a receiver stage connected to the output of the at least two LNA stages, the receiver stage being configured to receive the filtered analog signal and to generate a digital output sequence;
a Fast Fourier Transform (FFT) signal processor configured to, during a first portion of the testing mode, process the digital output sequence to estimate a frequency response of the first LNA stage to the amplified wideband test signal, the estimated frequency response of the first LNA stage comprising a first set of FFT output values; and
a controller circuit in communication with the FFT signal processor, the first LNA stage, and the second LNA stage, the controller circuit being configured to, during the first portion of the testing mode, iteratively calibrate the first bandwidth and the first resonant frequency of the first tunable bandpass filter of the first LNA stage based at least in part on selected FFT output values from the first set of FFT output values of the estimated frequency response of the first LNA stage from the FFT signal processor.

D2. The apparatus of claim D1, wherein the controller circuit is further configured to process the selected FFT output values from the first set of FFT output values to determine signal magnitudes at a desired first center frequency, a desired first lower cutoff frequency, and a desired first upper cutoff frequency of the first tunable bandpass filter of the first LNA stage.

D3. The apparatus of claim D2, wherein the controller circuit being further configured to process the selected FFT output values from the first set of FFT output values comprises the controller circuit being configured to average pairs of the selected FFT output values from the first set of FFT output values to determine the signal magnitudes at the desired first center frequency, the desired first lower cutoff frequency, and the desired first upper cutoff frequency of the first tunable bandpass filter of the first LNA stage.

D4. The apparatus of claim D2, wherein the controller circuit being further configured to process the selected FFT output values from the first set of FFT output values comprises the controller circuit being configured to use at least some of the selected FFT output values from the first set of FFT output values as the signal magnitudes at the desired first center frequency, the desired first lower cutoff frequency, and the desired first upper cutoff frequency of the first tunable bandpass filter of the first LNA stage.

D5. The apparatus of claim D2, wherein the controller circuit being configured to, during the first portion of the testing mode, iteratively calibrate the first bandwidth and the first resonant frequency of the first tunable bandpass filter of the first LNA stage comprises the controller circuit being configured to:
compare the signal magnitude at the desired first lower cutoff frequency of the first tunable bandpass filter with the signal magnitude at the desired upper cutoff frequency of the first tunable bandpass filter.

D6. The apparatus of claim D2, wherein the controller circuit being configured to, during the first portion of the testing mode, iteratively calibrate the first bandwidth and the first resonant frequency of the first tunable bandpass filter of the first LNA stage comprises the controller circuit being configured to:
iteratively adjust the first resonant frequency and a first quality factor the first tunable bandpass filter until (1) the signal magnitudes at the desired first upper cutoff frequency and the desired first lower cutoff frequency of the tunable bandpass filter are substantially equivalent and (2) the signal magnitudes at the desired first upper and first lower cutoff frequencies are substantially −3 dB down from the signal magnitude at the desired center frequency of the first tunable bandpass filter.

D7. The apparatus of claim D1, wherein the controller circuit being configured to, during the first portion of the testing mode, iteratively calibrate the first bandwidth and the first resonant frequency of the first tunable bandpass filter of the first LNA stage comprises the controller circuit being configured to adjust a first quality factor of the first tunable bandpass filter of the first LNA stage and to adjust the first resonant frequency of the first tunable bandpass filter of the filter LNA stage.

D8. The apparatus of claim D1, wherein the FFT signal processor is further configured to:
during a second portion of the testing mode, process the digital output sequence to estimate a frequency response of the second LNA stage to the amplified wideband test signal, the estimated frequency response of the second LNA stage comprising a second set of FFT output values.

D9. The apparatus of claim D8, wherein the controller circuit is further configured to:
during the second portion of the testing mode, iteratively calibrate the second bandwidth and the second resonant frequency of the second tunable bandpass filter of the second LNA stage based at least in part on selected FFT output values from the second set of FFT output values of the estimated frequency response of the second LNA stage from the FFT signal processor.

D10. The apparatus of claim D1, wherein the controller circuit is further configured to:
during the first portion of the testing mode, reduce a first quality factor of the second tunable bandpass filter of the second LNA stage such that the second tunable bandpass filter approaches a flat frequency response;
during a second portion of the testing mode, reduce a second quality factor of the first tunable bandpass filter of the first LNA stage such that the first tunable bandpass filter approaches a flat frequency response.

D11. The apparatus of claim D10, wherein the first and second portions of the testing mode partially overlap with one another in time.

D12. The apparatus of claim D10, wherein the second portion of the testing mode occurs before the first portion of the testing mode within one or more testing periods in the testing mode.

D13. The apparatus of claim D1, wherein the wideband amplifier is further configured to, during an operating mode, receive a modulated radio frequency signal with a variable phase component.

D14. The apparatus of claim D1, wherein the wideband amplifier provides impedance matching to a balun and an antenna.

D15. The apparatus of claim D1, wherein an input of the second LNA stage is connected to an output of the wideband amplifier and wherein an output of the second LNA stage is connected to an input of the first LNA stage.

D16. The apparatus of claim D1, wherein an input of the first LNA stage is connected to an output of the wideband amplifier and wherein an output of the first LNA stage is connected to the input of the second LNA stage.

D17. The apparatus of claim D16, further comprising at least one of:
a first buffer connecting the output of the first LNA stage to the input of the second LNA stage; or
a second buffer connecting the output of the at least two LNA stages to the receiver stage.

D18. The apparatus of claim D1, wherein the digital output sequence comprises in-phase (I) and quadrature (Q) baseband signals.

D19. The apparatus of claim D1, wherein the receiver stage comprises:
a polar receiver configured to output amplitude and phase digital sample values; and
a CORDIC signal generator configured to receive the amplitude and phase digital sample values from the polar receiver and to perform polar to rectangular coordinate conversion to generate the digital output sequence as in-phase (I) and quadrature (Q) rectangular coordinate digital sample values.

D20. The apparatus of claim D1, wherein the apparatus is further configured to:
calibrate the receiver stage toward a desired center frequency of the desired overall bandwidth of the at least two LNA stages.

D21. The apparatus of claim D1, further comprising:
a test signal generator in communication with the controller circuit, the test signal generator configured to, during the testing mode, generate the wideband test signal.

D22. The apparatus of claim D21, wherein the test signal generator comprises a transmitter, the transmitter being configured to, during the testing mode, generate the wideband test signal, the transmitter being further configured to, during an operating mode, transmit at least one of a phase modulated or a frequency modulated radio frequency signal.

D23. The apparatus of claim D1, wherein the wideband test signal is an Orthogonal Frequency Division Multiplexing (OFDM) training sequence having equivalent signal components spaced at multiple distinct frequencies over a wider spectrum than the desired overall bandwidth of the at least two LNA stages.

D24. The apparatus of claim D1, further comprising:
a transmitter, the transmitter configured to, during the testing mode, transmit the wideband test signal, wherein the transmitter being configured to, during the testing mode, transmit the wideband test signal, comprises:
the transmitter being configured to, during the first portion of the testing mode, transmit the wideband test signal centered at a desired first center frequency of the first tunable bandpass filter of the first LNA stage; and
the transmitter being configured to, during a second portion of the testing mode, transmit the wideband test signal centered at a desired second center frequency of the second tunable bandpass filter of the second LNA stage.

D25. The apparatus of claim D24, wherein the wideband test signal centered at the desired first center frequency is an identical signal to the wideband test signal centered at the desired second center frequency except for the centering of the wideband test signal.

D26. The apparatus of claim D1, wherein the first LNA stage further comprises:
a variable gain amplifier stage coupled to the first tunable bandpass filter of the first LNA stage.

E1. A method, comprising:
filtering, using a tunable bandpass filter, a wideband test signal, wherein the wideband test signal is centered at a desired center frequency of the tunable bandpass filter;
applying a Fast Fourier Transform (FFT) algorithm to the filtered version of the wideband test signal to estimate a frequency response of the tunable bandpass filter; and
calibrating the tunable bandpass filter by adjusting at least one of a quality factor and a resonant frequency of the tunable bandpass filter based at least in part on the estimated frequency response of the tunable bandpass filter at the desired center frequency of the tunable bandpass filter and one or more other frequencies defining a desired bandwidth of the tunable bandpass filter.

E2. The method of claim E1, wherein the tunable bandpass filter is located on a receive path and wherein the method further comprises:
following calibration of at least the tunable bandpass filter, receiving a modulated radio frequency signal having a variable phase component.

E3. The method of claim E1, wherein the tunable bandpass filter is located on a transmit path and wherein the method further comprises:

following calibration of at least the tunable bandpass filter, transmitting a modulated radio frequency signal having a variable phase component.

E4. The method of claim E3, further comprising:
transmitting the filtered version of the wideband test signal;
receiving the transmitted filtered version of the wideband test signal at an antenna;
generating a digital output sequence at a receiver stage from the received transmitted filtered version of the wideband test signal, and
wherein applying the FFT algorithm to the filtered version of the wideband test signal to estimate the frequency response of the tunable bandpass filter comprises analyzing the digital output sequence of the receiver stage by applying the FFT algorithm to the digital output sequence.

E5. The method of claim E1, further comprising:
permitting focused estimation of the frequency response of the tunable bandpass filter by reducing a quality factor of a second tunable bandpass filter.

E6. The method of claim E5, further comprising:
permitting focused estimation of a frequency response of the second tunable bandpass filter by reducing the quality factor of the first tunable bandpass filter;
filtering, using the second tunable bandpass filter, a second wideband test signal, wherein the second wideband test signal is centered at a desired center frequency of the second tunable bandpass filter;
applying the FFT algorithm to the filtered version of the second wideband test signal to estimate the frequency response of the second tunable bandpass filter; and
calibrating the second tunable bandpass filter based at least in part on the estimated frequency response of the second tunable bandpass filter at the desired center frequency of the second tunable bandpass filter and one or more other frequencies defining a desired bandwidth of the second tunable bandpass filter.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A method, comprising:
reducing a quality factor of a first tunable bandpass filter for a first calibration period;
receiving a first wideband test signal centered at a desired center frequency of a second tunable bandpass filter;
during the first calibration period, estimating a frequency response of the second tunable bandpass filter to the first wideband test signal using a Fast Fourier Transform (FFT) signal processor;
calibrating at least a resonant frequency or a quality factor of the second tunable bandpass filter based at least in part on a portion of the estimated frequency response of the second tunable bandpass filter obtained from the FFT signal processor;
following the first calibration period, reducing the quality factor of the second tunable bandpass filter for a second calibration period;
receiving a second wideband test signal centered at a desired center frequency of the first tunable bandpass filter;
during the second calibration period, estimating a frequency response of the first tunable bandpass filter to the second wideband test signal using the FFT signal processor; and
calibrating at least a resonant frequency or the quality factor of the first tunable bandpass filter based at least in part on a portion of the estimated frequency response of the first tunable bandpass filter obtained from the FFT signal processor.

2. The method of claim 1, wherein a first low-noise amplifier (LNA) stage comprises the first tunable bandpass filter and a second LNA stage comprises the second tunable bandpass filter.

3. The method of claim 2, wherein an output of the first LNA stage is connected to an input of the second LNA stage.

4. The method of claim 2, wherein an output of the second LNA stage is connected to an input of the first LNA stage.

5. The method of claim 1, wherein the first and second wideband test signals are identical apart from being centered at different desired center frequencies, the desired center frequency of the first tunable bandpass filter being different from the desired center frequency of the second tunable bandpass filter.

6. The method of claim 1, wherein at least the first wideband test signal is an Orthogonal Frequency Division Multiplexing (OFDM) training sequence.

7. The method of claim 1, wherein at least the first wideband test signal comprises a multi-tone signal having signal components at multiple distinct tones within the same signal.

8. The method of claim 1, further comprising:
prior to determining the estimated frequency response of the first second bandpass filter, calibrating a receiver stage, wherein an input of the receiver stage is connected to an output of the second tunable bandpass filter and an output of the receiver stage is connected to an input of the FFT signal processor.

9. The method of claim 1, further comprising:
prior to determining the estimated frequency response of the second tunable bandpass filter, performing a coarse calibration of the second tunable bandpass filter.

10. The method of claim 9, wherein performing the coarse calibration of the second tunable bandpass filter comprises:
inducing an oscillation in the second tunable bandpass filter;
measuring the resonant frequency of the second tunable bandpass filter; and
adjusting the resonant frequency of the second tunable bandpass filter toward a desired center frequency prior to receiving the first wideband test signal centered at the desired center frequency of the second tunable bandpass filter.

11. A method, comprising:
permitting focused estimation of a frequency response of a first tunable bandpass filter by reducing a quality factor of a second tunable bandpass filter;
receiving a wideband test signal, wherein the wideband test signal is centered at a desired center frequency of the first tunable bandpass filter;
generating a digital output sequence at a receiver stage from a filtered version of the wideband test signal provided to the receiver stage from a cascade of at the first and the second tunable bandpass filters;
analyzing the digital output sequence of the receiver stage by applying a Fast Fourier Transform (FFT) algorithm to the digital output sequence to estimate the frequency response of the first tunable bandpass filter;
calibrating the first tunable bandpass filter by adjusting at least one of a quality factor and a resonant frequency of the first tunable bandpass filter based at least in part on the estimated frequency response of the first tunable bandpass filter at the desired center frequency of the first tunable bandpass filter and one or more other frequencies defining a desired bandwidth of the first tunable bandpass filter; and
following calibration of the first tunable bandpass filter, receiving a modulated radio frequency signal having a variable phase component.

12. The method of claim 11, wherein a first low-noise amplifier (LNA) stage comprises the first tunable bandpass filter and a second LNA stage comprises the second tunable bandpass filter, and
wherein calibrating the first tunable bandpass filter comprises adjusting a gain of the first LNA stage.

13. The method of claim 11, wherein the one or more frequencies defining a desired bandwidth of the first tunable bandpass filter comprise a desired lower cutoff frequency and a desired upper frequency of the first tunable bandpass filter.

14. The method of claim 11, further comprising:
prior to receiving the modulated radio frequency signal having the variable phase component:

permitting focused estimation of a frequency response of the second tunable bandpass filter by reducing the quality factor of the first tunable bandpass filter;

receiving a second wideband test signal, wherein the second wideband test signal is centered at a desired center frequency of the second tunable bandpass filter;

generating a second digital bit sequence at the receiver stage from a filtered version of the second wideband test signal provided to the receiver stage from the cascade of at least the first and second tunable bandpass filters;

analyzing the second digital bit sequence of the receiver stage by applying the FFT algorithm to the digital bit sequence to estimate the frequency response of the second tunable bandpass filter; and calibrating the second tunable bandpass filter based at least in part on the estimated frequency response of the second tunable bandpass filter at the desired center frequency of the second tunable bandpass filter and one or more other frequencies defining a desired bandwidth of the second tunable bandpass filter.

15. The method of claim 11, further comprising:
further permitting focused estimation of the frequency response of the first tunable bandpass filter by calibrating the receiver stage prior to determining the estimated frequency response of the first tunable bandpass filter.

16. A method implemented by a polar transceiver, comprising:
transmitting, during a testing mode, a wideband test signal centered at a desired center frequency of a tunable bandpass filter of a low-noise amplifier (LNA) stage;
amplifying the wideband test signal in at least the LNA stage to generate an amplified analog output signal;
performing Fast Fourier Transform (FFT) analysis on a digital output sequence derived from the amplified analog output signal to provide an estimated frequency response of the LNA stage, the estimated frequency response including signal magnitudes at multiple frequencies of the wideband test signal;
responsively calibrating the tunable bandpass filter based at least in part on the estimated frequency response of the LNA stage through an iterative algorithmic process comprising:
adjusting a resonant frequency of the tunable bandpass filter by comparing the signal magnitude at a desired upper cutoff frequency with the signal magnitude at a desired lower cutoff frequency until the signal magnitudes are substantially equivalent; and
adjusting a quality factor of the tunable bandpass filter until the signal magnitudes at the desired upper and lower cutoff frequencies are substantially −3 dB down from the signal magnitude at the desired center frequency,
wherein adjusting the resonant frequency and adjusting the quality factor are performed at least partly in parallel during and throughout the iterative algorithmic process;
and
during an operating mode following the testing mode, transmitting a first modulated radio frequency signal having a variable phase component.

17. The method of claim 16, wherein responsively calibrating the tunable bandpass filter based at least in part on the estimated frequency response through the iterative algorithmic process further comprises:
adjusting a gain of the LNA stage, wherein adjusting the gain, adjusting the resonant frequency, and adjusting the quality factor are all performed at least partly in parallel during and throughout the iterative algorithmic process.

18. The method of claim 16, wherein responsively calibrating the tunable bandpass filter based at least in part on the estimated frequency response through the iterative algorithmic process further comprises:
obtaining at least some signal magnitudes from the estimated frequency response of the LNA stage; and
determining the signal magnitude at the desired upper cutoff frequency, the signal magnitude at the desired lower cutoff frequency, and the signal magnitude at the desired center frequency by averaging pairs of signal magnitudes from the at least some signal magnitudes obtained from the estimated frequency response of the LNA stage.

19. An apparatus comprising:
a wideband amplifier configured to, during a testing mode, receive and amplify a wideband test signal;
at least two low-noise amplifier (LNA) stages being cascaded together and having an input connected to the wideband amplifier and having an output, the at least two LNA stages together being configured to receive the amplified wideband test signal at the input to generate, within a desired overall bandwidth for the at least two LNA stages, a filtered analog signal at the output, the at least two LNA stages comprising a first LNA stage and a second LNA stage, the first LNA stage comprising a first tunable bandpass filter, the first tunable bandpass filter having a first bandwidth and a first resonant frequency, and the second LNA stage comprising a second tunable bandpass filter, the second tunable bandpass filter having a second bandwidth and a second resonant frequency;
a receiver stage connected to the output of the at least two LNA stages, the receiver stage being configured to receive the filtered analog signal and to generate a digital output sequence;
a Fast Fourier Transform (FFT) signal processor configured to, during a first portion of the testing mode, process the digital output sequence to estimate a frequency response of the first LNA stage to the amplified wideband test signal, the estimated frequency response of the first LNA stage comprising a first set of FFT output values; and
a controller circuit in communication with the FFT signal processor, the first LNA stage, and the second LNA stage, the controller circuit being configured to, during the first portion of the testing mode, iteratively calibrate the first bandwidth and the first resonant frequency of the first tunable bandpass filter of the first LNA stage based at least in part on selected FFT output values from the first set of FFT output values of the estimated frequency response of the first LNA stage from the FFT signal processor.

20. A method, comprising:
filtering, using a tunable bandpass filter, a wideband test signal, wherein the wideband test signal is centered at a desired center frequency of the tunable bandpass filter;
applying a Fast Fourier Transform (FFT) algorithm to the filtered version of the wideband test signal to estimate a frequency response of the tunable bandpass filter; and
calibrating the tunable bandpass filter by adjusting at least one of a quality factor and a resonant frequency of the tunable bandpass filter based at least in part on the estimated frequency response of the tunable bandpass filter at the desired center frequency of the tunable bandpass filter and one or more other frequencies defining a desired bandwidth of the tunable bandpass filter.

* * * * *